United States Patent
Endo et al.

(10) Patent No.: US 8,168,485 B2
(45) Date of Patent: May 1, 2012

(54) SEMICONDUCTOR DEVICE MAKING METHOD

(75) Inventors: Takeshi Endo, Toyota (JP); Eiichi Okuno, Mizuho (JP); Takeo Yamamoto, Nishikamo-gun (JP); Hirokazu Fujiwara, Nishikamo-gun (JP); Masaki Konishi, Toyota (JP); Yukihiko Watanabe, Nagoya (JP); Takashi Katsuno, Nisshin (JP)

(73) Assignee: DENSO CORPORATION, Kariya (JP)

( * ) Notice: Subject to any disclaimer, the term of this patent is extended or adjusted under 35 U.S.C. 154(b) by 182 days.

(21) Appl. No.: 12/461,205

(22) Filed: Aug. 4, 2009

(65) Prior Publication Data

US 2010/0032730 A1 Feb. 11, 2010

(30) Foreign Application Priority Data

Aug. 5, 2008 (JP) .................................. 2008-201495
Dec. 12, 2008 (JP) .................................. 2008-317497

(51) Int. Cl.
*H01L 29/812* (2006.01)
*H01L 21/338* (2006.01)

(52) U.S. Cl. ......... 438/167; 438/180; 257/280; 257/281

(58) Field of Classification Search .................. 257/73, 257/E21.062, E21.064, E21.067, E29.148, 257/E29.198, E29.317, E29.338; 438/167, 438/185, 534, 570, 571, 573, 574, 578

See application file for complete search history.

(56) References Cited

U.S. PATENT DOCUMENTS

| 7,274,083 | B1 | 9/2007 | Sankin et al. | |
|---|---|---|---|---|
| 7,615,839 | B2 * | 11/2009 | Souma et al. | 257/473 |
| 2002/0109200 | A1 * | 8/2002 | Bartsch et al. | 257/471 |
| 2002/0125482 | A1 | 9/2002 | Friedrichs et al. | |
| 2004/0211980 | A1 * | 10/2004 | Ryu | 257/200 |
| 2007/0108547 | A1 * | 5/2007 | Zhu et al. | 257/471 |

* cited by examiner

*Primary Examiner* — Jerome Jackson, Jr.
*Assistant Examiner* — David Spalla
(74) *Attorney, Agent, or Firm* — Posz Law Group, PLC

(57) ABSTRACT

A method of making a semiconductor device includes forming a p-type semiconductor region to an n-type semiconductor substrate in such a manner that the p-type semiconductor region is partially exposed to a top surface of the semiconductor substrate, forming a Schottky electrode of a first material in such a manner that the Schottky electrode is in Schottky contact with an n-type semiconductor region exposed to the top surface of the semiconductor substrate, and forming an ohmic electrode of a second material different from the first material in such a manner that the ohmic electrode is in ohmic contact with the exposed p-type semiconductor region. The Schottky electrode is formed earlier than the ohmic electrode.

19 Claims, 19 Drawing Sheets

| OHMIC ELECTRODE | Al | Ni |
|---|---|---|
| SCHOTTKY ELECTRODE | Ni, Ti, Mo | Ti, Mo |
| ANNEALING TREATMENT | OPTION ROOM TEMP ~ 650°C | MUST 400°C OR MORE |

SEMICONDUCTOR DEVICE MAKING METHOD

CROSS REFERENCE TO RELATED APPLICATION

This application is based on and incorporates herein by reference Japanese Patent Application No. 2008-201495 filed on Aug. 5, 2008 and No. 2008-317497 filed on Dec. 12, 2008.

FIELD OF THE INVENTION

The present invention generally relates to semiconductor devices and, in particular, relates to a semiconductor device that includes a Schottky barrier diode section and a p-n diode section.

BACKGROUND OF THE INVENTION

A semiconductor device has been proposed that includes a junction barrier Schottky diode structure. In the junction barrier Schottky diode structure, a Schottky barrier diode section and a p-n diode section are arranged adjacent to each other. In this type of semiconductor device, under reverse bias, a depletion layer formed at a p-n diode section extends to a Schottky barrier diode section so that a reduction in leak current and an increase in surge strength can be achieved. Further, under forward bias, a low on-resistance and a fast reverse recovery time can be achieved by the Schottky barrier diode section.

US 2002/0125482 corresponding to JP-A-2003-510817 discloses a semiconductor device that includes a junction barrier Schottky diode structure. The semiconductor device includes an n-type semiconductor substrate having a p-type semiconductor region exposed to its top surface. An electrode made of an alloy of nickel and aluminum is formed on the top surface of the semiconductor substrate. The electrode is in Schottky contact with an n-type semiconductor region exposed to the top surface. of the semiconductor substrate. Further, the electrode is in ohmic contact with the p-type semiconductor region exposed to the top surface of the semiconductor substrate.

U.S. Pat. No. 7,274,083 also discloses a semiconductor device that includes a junction barrier Schottky diode structure. The semiconductor device includes an n-type semiconductor substrate having a p-type semiconductor region on its top surface. The p-type semiconductor region has a mesa structure. A Schottky electrode and an ohmic electrode are individually formed on the top surface of the semiconductor substrate. The Schottky electrode is in Schottky contact with an n-type semiconductor region exposed to the top surface of the semiconductor substrate. The ohmic electrode is in ohmic contact with the p-type semiconductor region exposed to the top surface of the semiconductor substrate.

In the semiconductor device disclosed in US 2002/0125482, a portion of the electrode in Schottky contact with the n-type semiconductor region of the semiconductor substrate and a portion of the electrode in ohmic contact with the p-type semiconductor region of the semiconductor substrate are made of the same kind of a material. Therefore, it may be difficult for the electrode to satisfy both characteristics required for a Schottky electrode and characteristics required for an ohmic electrode.

In the semiconductor device disclosed in U.S. Pat. No. 7,274,083, the Schottky electrode and the ohmic electrode are individually formed. Specifically, the Schottky electrode is formed, after the ohmic electrode is formed. In this case, there is a possibility that a material used to form the ohmic electrode remains left on the surface of the semiconductor substrate, when the Schottky electrode is formed on the surface. If a foreign matter is interposed between the semiconductor substrate and the Schottky electrode, a Schottky contact between the semiconductor substrate and the Schottky electrode changes greatly. The change in the Schottky contact may cause problems such as an increase in leak current.

SUMMARY OF THE INVENTION

In view of the above, it is an object of the present invention to provide a technique for improving a characteristic of a semiconductor device having a junction barrier Schottky diode structure.

According to an aspect of the present invention, a method of making a semiconductor device includes forming a p-type semiconductor region to an n-type semiconductor substrate in such a manner that the p-type semiconductor region is partially exposed to a top surface of the semiconductor substrate, forming a Schottky electrode of a first material in such a manner that the Schottky electrode is in Schottky contact with an n-type semiconductor region exposed to the top surface of the semiconductor substrate, and forming an ohmic electrode of a second material different from the first material in such a manner that the ohmic electrode is in ohmic contact with the exposed p-type semiconductor region. The Schottky electrode is formed earlier than the ohmic electrode.

According to another aspect of the present invention, a semiconductor device includes an n-type semiconductor substrate, a Schottky electrode, and an ohmic electrode. The semiconductor substrate has a top surface and a p-type semiconductor region exposed to the top surface. The Schottky electrode is in Schottky contact with an n-type semiconductor region exposed to the top surface. The ohmic electrode is in ohmic contact with the exposed p-type semiconductor region. The Schottky electrode and the ohmic electrode are made of different materials. The ohmic electrode covers at least a portion of the Schottky electrode from above.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS (First Embodiment)

A semiconductor device 10 according to a first embodiment of the present invention is described below with reference to FIG. 1. The semiconductor device 10 is a so-called junction barrier Schottky diode (JBS) including a Schottky barrier diode section 12 and a p-n diode section 14 that are alternately arranged.

Figure 1:
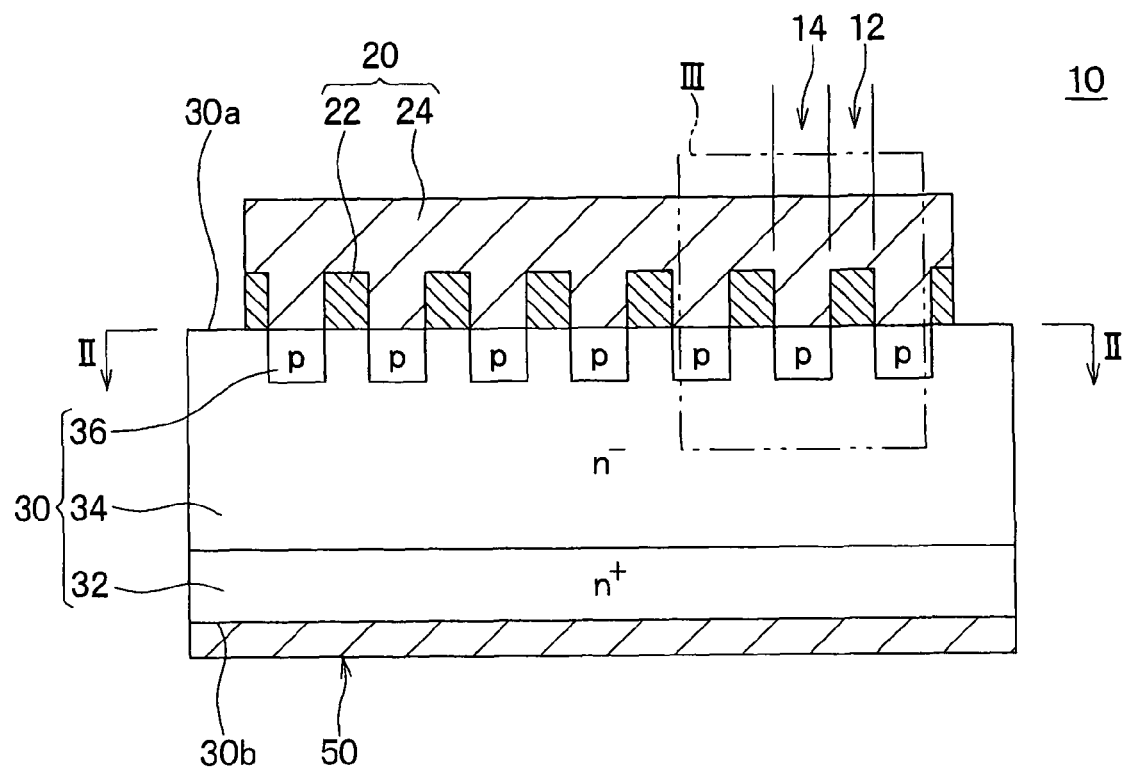
FIG. 1 is a diagram illustrating a cross-sectional view of a semiconductor device according to a first embodiment of the present invention.

As shown in FIG. 1, the semiconductor device 10 includes a semiconductor substrate 30, a top electrode 20 formed on a top surface 30a of the semiconductor substrate 30, and a bottom electrode 50 formed on a bottom surface 30b of the semiconductor substrate 30.

The semiconductor substrate 30 is a silicon carbide crystal (for example, 4H—SiC or 6H—SiC) with a hexagonal crystal structure. The semiconductor substrate 30 is almost an n-type semiconductor crystal doped with an n-type impurity. The semiconductor substrate 30 includes a contact layer 32 on the bottom surface 30b side. Further, the semiconductor substrate 30 includes a drift layer 34 on the contact layer 32. The contact layer 32 is doped with a high concentration of an n-type impurity, and the drift layer 34 is doped with a low concentration of an n-type impurity. In the first embodiment, for example, the contact layer 32 can be doped with nitrogen (N) with a concentration of $5 \times 10^{18}/cm^3$, and the drift layer 34 can be doped with nitrogen (N) with a concentration of $5 \times 10^{15}/cm^3$. The thickness of the drift layer can be 13 μm, for example.

A p-type semiconductor region 36 is formed to the semiconductor substrate 30. Specifically, the p-type semiconductor region 36 is formed in an area corresponding to the p-n diode section 14. In the p-n diode section 14, an n-type semiconductor region (i.e., the contact layer 32 and the drift layer 34) and the p-type semiconductor region 36 are stacked between the bottom surface 30b and the top surface 30a of the semiconductor substrate 30. By contrast, in the Schottky barrier diode section 12, only the n-type semiconductor region (i.e., the contact layer 32 and the drift layer 34) is located between the bottom surface 30b and the top surface 30a of the semiconductor substrate 30.

The p-type semiconductor region 36 is formed to an upper portion of the drift layer 34 and exposed to the top surface 30a of the semiconductor substrate 30. In the first embodiment, for example, the p-type semiconductor region 36 can be doped with aluminum (Al) with a concentration of $1.0 \times 10^{19}/cm^3$.

Figure 2:
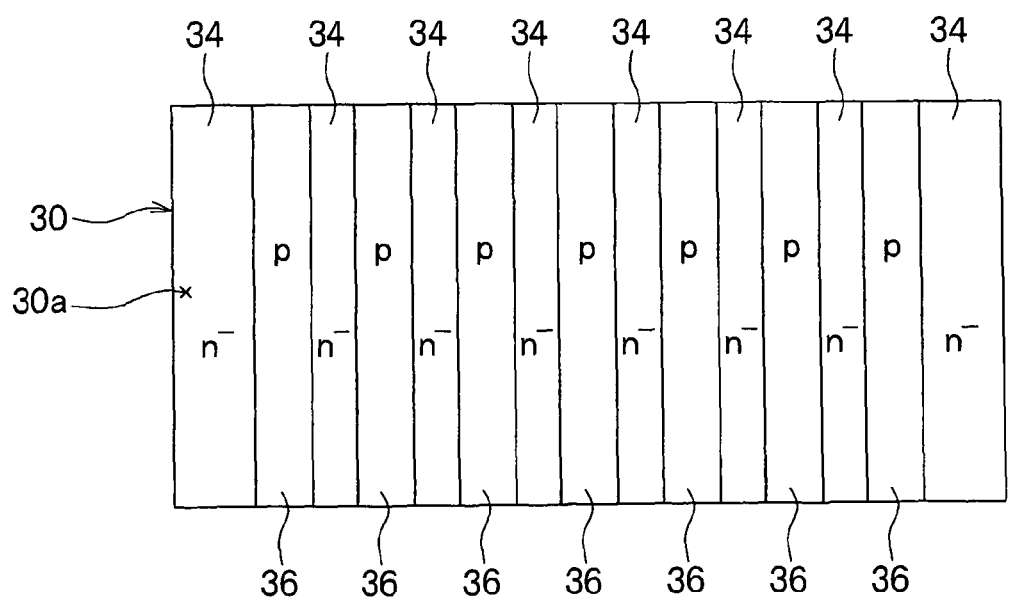
FIG. 2 is a diagram illustrating a cross-sectional view taken along the line II-II in FIG. 1.

FIG. 2 is a cross-sectional view taken along the line II-II of FIG. 1 and illustrates the top surface 30a of the semiconductor substrate 30. As shown in FIGS. 1 and 2, the p-type semiconductor region 36 is formed in a stripe pattern along a left-right direction of FIG. 2. Thus, the drift layer 34 and the p-type semiconductor region 36 are alternately exposed to the top surface 30a of the semiconductor substrate 30 along the left-right direction of FIG. 2.

Figures 3, 4:
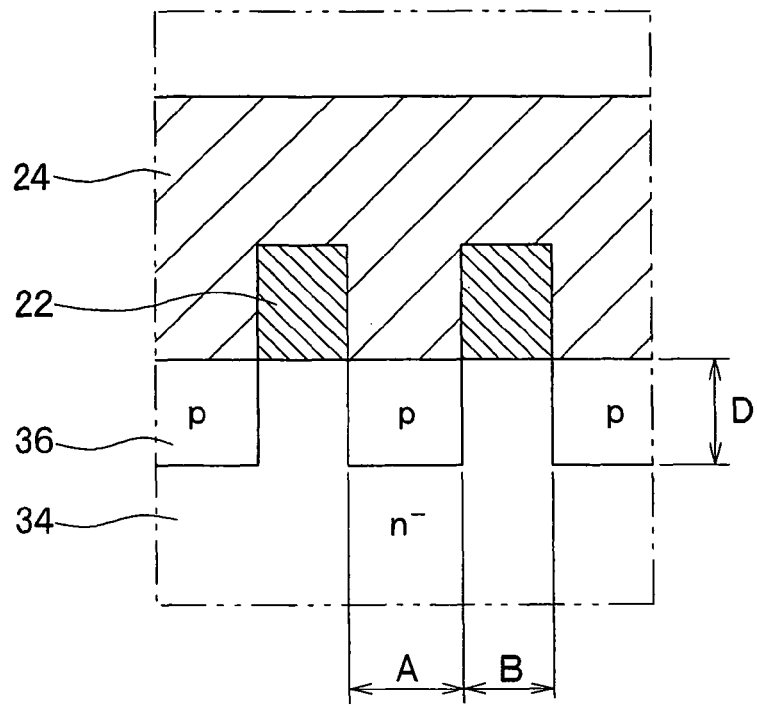
FIG. 3 is a diagram illustrating an enlarged view of a portion enclosed by the line III in FIG. 1.
FIG. 4 is a diagram illustrating examples of combinations of materials for a Schottky electrode and an ohmic electrode.

FIG. 3 is an enlarged view of a portion enclosed by the line III of FIG. 1. In the first embodiment, for example, a width A of the p-type semiconductor region 36 can be 2 μm, a separation distance B between adjacent p-type semiconductor regions 36 can be 2 μm, and a thickness D of the p-type semiconductor region 36 can be 0.5 μm. The width A, the separation distance B, and the thickness D of the p-type semiconductor region 36 are not limited to the above-described values.

Further, the p-type semiconductor region 36 can be formed in a pattern other than a stripe. For example, the p-type semiconductor region 36 can be formed in a grid pattern or a honeycomb patter. When the p-type semiconductor region 36 is formed in a grid pattern, the p-type semiconductor region 36 and the n-type semiconductor region are regularly exposed to the top surface 30a of the semiconductor substrate 30 along two directions perpendicular to each other. When the p-type semiconductor region 36 is formed in a honeycomb pattern, the p-type semiconductor region 36 and the n-type semiconductor region are regularly exposed to the top surface 30a of the semiconductor substrate 30 along three directions 120 degrees apart. The p-type semiconductor region 36 can be designed in various patterns by taking into considerations a depletion layer extending from the p-type semiconductor region 36. The p-type semiconductor region 36 can be designed in various patterns that achieve a so-called super junction structure.

The top electrode 20 is described in details below. As shown in FIGS. 1 and 3, the top electrode 20 includes a Schottky electrode 22 and an ohmic electrode 24. The Schottky electrode 22 is made of a first metal material, and the ohmic electrode 24 is made of a second metal material different from the first metal material. That is, the Schottky electrode 22 and the ohmic electrode 24 are made of different metal materials. The Schottky electrode 22 is in Schottky contact with the drift layer 34 that is exposed to the top surface 30a of the semiconductor substrate 30. The ohmic electrode 24 is in ohmic contact with the p-type semiconductor region 36 that is exposed to the top surface 30a of the semiconductor substrate 30. The ohmic electrode 24 is greater in thickness than the Schottky electrode 22 and covers the Schottky electrode 22 from above. The Schottky electrode 22 and the ohmic electrode 24 are in direct contact with each other and electrically connected to each other. In this way, the Schottky electrode 22 and the ohmic electrode 24 are united with each other. Alternatively, another conductive material can be interposed between the Schottky electrode 22 and the ohmic electrode 24. That is, the ohmic electrode 24 can cover the Schottky electrode 22 from above through another conductive material. This structure, in which the ohmic electrode 24 covers the Schottky electrode 22, results from a method of making the semiconductor device 10 as described later.

FIG. 4 illustrates examples of combinations of the first metal material for the Schottky electrode 22 and the second metal material for the ohmic electrode 24. As shown in FIG. 4, the ohmic electrode 24 can be made of aluminum (Al) or nickel (Ni). It is noted that when the ohmic electrode 24 is made of nickel, there is a need to perform an annealing treatment (e.g., at a temperature of 400° C. or more) to stabilize ohmic contact. The Schottky electrode 22 can be made of nickel (Ni), titanium (Ti), or molybdenum (Mo). It is noted that when the ohmic electrode 24 is made of nickel, the Schottky electrode 22 needs to be made of titanium or molybdenum for the following reasons.

As mentioned previously, when the ohmic electrode 24 is made of nickel, there is a need to perform an annealing treatment. Although details are described later, according to the method of making the semiconductor device 10, the Schottky electrode 22 is always formed earlier than the ohmic electrode 24. Since the Schottky electrode 22 exists already at a time of performing a thermal treatment of the ohmic electrode 24, the Schottky electrode 22 is subjected to an annealing treatment as well as the ohmic electrode 24. In this case, if the Schottky electrode 22 is made of nickel, the Schottky electrode 22 cannot maintain its Schottky characteristics after the annealing treatment. That is, like the ohmic electrode 24, the Schottky electrode 22 comes into ohmic contact with the top surface 30a of the semiconductor substrate 30 due to the annealing treatment. Therefore, when the ohmic electrode 24 is made of nickel, the Schottky electrode 22 needs to be made of titanium or molybdenum.

In the first embodiment, it is assumed that the Schottky electrode 22 is made of molybdenum and that the ohmic electrode 24 is made of aluminum.

The bottom electrode 50 is in ohmic contact with the contact layer 32 of the semiconductor substrate 30. The bottom electrode 50 can have a typical ohmic contact electrode structure. For example, the bottom electrode 50 can have a Ti/Ni/Au stacked structure or a NiSi/Ni/Au stacked structure.

As described above, according to the semiconductor device 10 of the first embodiment, the Schottky barrier diode section 12 and the p-n diode section 14 are alternately arranged along one direction on the top surface 30a of the semiconductor substrate 30. The Schottky barrier diode section 12 includes the n-type semiconductor region (the drift layer 34) exposed to the top surface 30a of the semiconductor substrate 30 and the Schottky electrode 22 of the top electrode 20. The p-n diode section 14 includes the p-type semiconductor region 36 exposed to the top surface 30a of the semiconductor substrate 30 and the ohmic electrode 24 of the top electrode 20.

When the semiconductor device 10 is reverse biased (i.e., the top electrode 20 is lower in potential), a depletion layer extends from a p-n junction between the p-type semiconductor region 36 and the drift layer 34 so that the drift layer 34 joined to the Schottky electrode 22 can be depleted. Thus, in the Schottky barrier diode section 12, leak current can be reduced, and surge strength can be increased. In contrast, when the semiconductor device 10 is forward biased, a forward direction voltage drop (i.e., on-resistance) can be limited by the Schottky barrier diode section 12.

As the impurity concentration of the drift layer 34 is lower, the depletion layer extends more from the p-n junction under reverse bias condition. That is, as the n-type impurity concentration of a region around the p-type semiconductor region 36 is lower, the depletion layer extends more from the p-n junction under reverse bias condition. For example, when the impurity concentration of the drift layer 34 is $5 \times 10^{15}/cm^3$, the drift layer 34 extends to 0.73 μm. Therefore, the separation distance B (refer to FIG. 3) between adjacent p-type semiconductor regions 36 can be increased up to 1.46 μm (1.4 μm in the present embodiment). For another example, when the impurity concentration of the drift layer 34 is $5 \times 10^{14}/cm^3$, the drift layer 34 extends to 2.31 μm. Therefore, the separation distance B can be increased up to 4.62 μm. When the separation distance B is increased, an area of the Schottky barrier diode section 12 is increased so that an on-resistance of the semiconductor device 10 can be reduced. However, if the impurity concentration of the semiconductor substrate 30 is excessively reduced, an on-resistance of the semiconductor substrate 30 is increased. Therefore, changing the impurity concentration of the drift layer 34 in its thickness direction is an effective way to reduce the on-resistance of the semiconductor device 10. That is, the on-resistance of the semiconductor device 10 can be effectively reduced by making the n-type impurity concentration relatively low at a region near the p-type semiconductor region 36 and by making the n-type impurity concentration relatively high at a region away from the p-type semiconductor region 36. That is, it is preferable that the impurity concentration of the drift layer 34 be higher on the bottom surface 30b side (i.e., contact layer 32 side) than on the top surface 30a side. In this case, the impurity concentration of the drift layer 34 can be changed stepwise or continuously in the thickness direction of the drift layer 34.

(A First Method of Making the Semiconductor Device 10)

Figure 5:
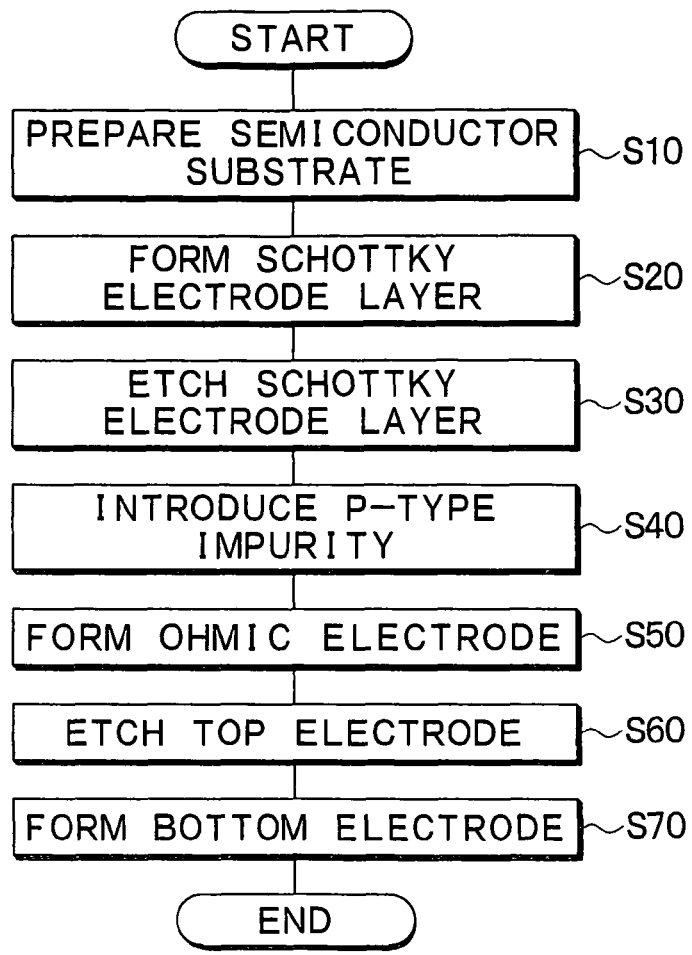
FIG. 5 is a flow chart illustrating a flow of a first method of making the semiconductor device of the first embodiment.

A first method of making the semiconductor device 10 is described below with reference to FIG. 5. FIG. 5 is a flow chart showing the flow of processes performed in the first method. According to the first method, multiple semiconductor devices 10 are made at once on a single wafer.

Figure 6:
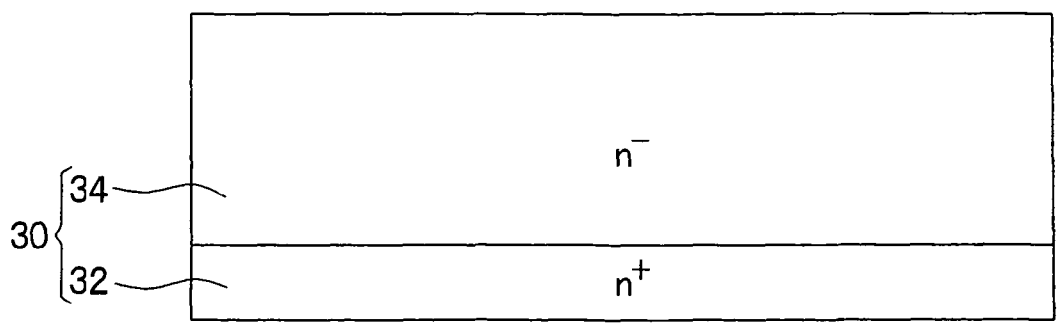
FIG. 6 is a diagram illustrating a process corresponding to S10 of the flow chart of FIG. 5.

Firstly, at S10, as shown in FIG. 6, the n-type semiconductor substrate 30 of silicon carbide is prepared. It is preferable that the semiconductor substrate 30 have a hexagonal crystal structure such as a 4H structure or a 6H structure. The contact layer 32 doped with a high concentration of an n-type impurity and the drift layer 34 doped with a low concentration of an n-type impurity are formed to the semiconductor substrate 30 successively from the bottom surface 30b side. A method of making the semiconductor substrate 30 is not limited to a specific method. In the first embodiment, an n-type silicon carbide wafer (with a 4H structure) as the contact layer 32 is prepared, and the drift layer 34 is epitaxially grown on the n-type silicon carbide wafer so that the semiconductor substrate 30 can be made. In the first embodiment, an impurity concentration of the silicon carbide wafer is $5\times10^{18}/cm^3$, and an impurity concentration of the drift layer 34 is $5\times10^{15}/cm^3$. The drift layer 34 is grown to the thickness of 13 µm.

Figure 7:
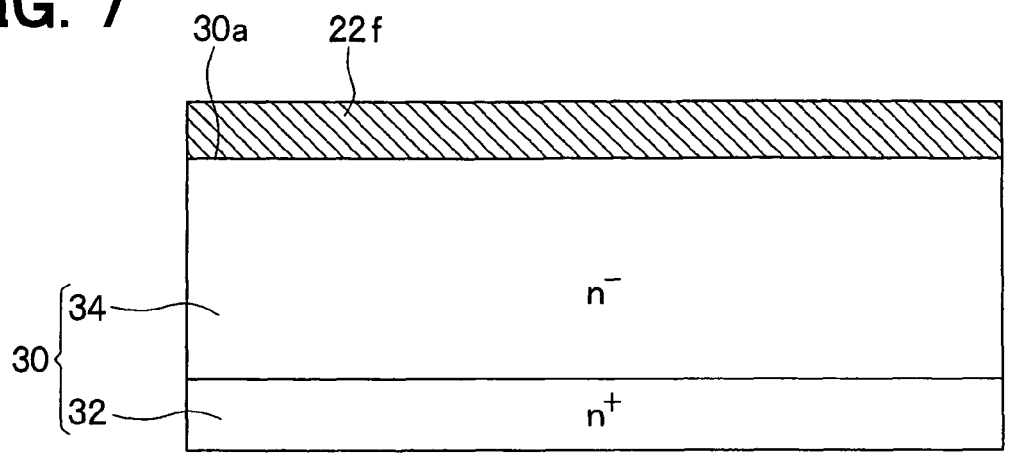
FIG. 7 is a diagram illustrating a process corresponding to S20 of the flow chart of FIG. 5.

Next, at S20, as shown in FIG. 7, a Schottky electrode layer 22f is formed on the top surface 30a of the semiconductor substrate 30. The Schottky electrode layer 22f is a metal layer used to form the Schottky electrode 22. In the first embodiment, a molybdenum layer is formed as the Schottky electrode layer 22f. For example, the Schottky electrode layer 22f can be formed by a vacuum deposition method.

Figure 8:
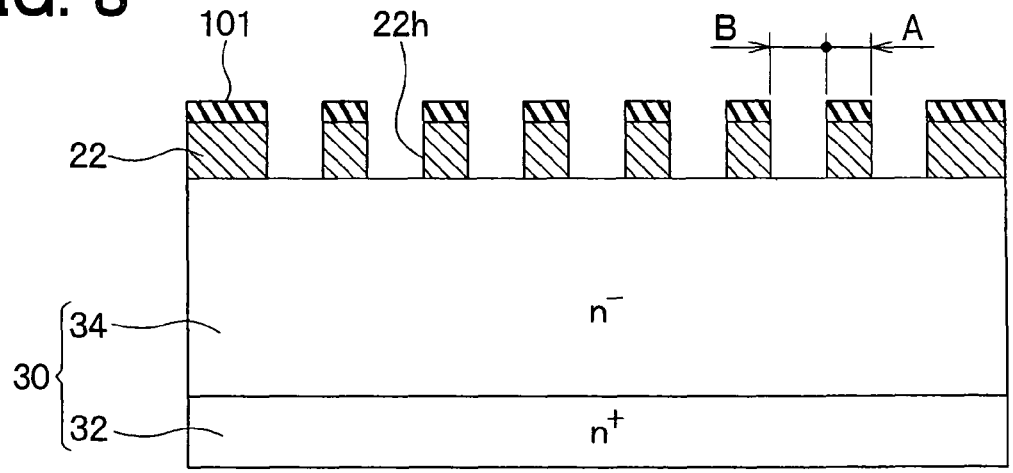
FIG. 8 is a diagram illustrating a process corresponding to S30 of the flow chart of FIG. 5.

Then, at S30, as shown in FIG. 8, the Schottky electrode layer 22f is partially removed by an etching process to form multiple openings 22h. In the etching process, a patterned mask 101 is formed by a photolithography process, and then a reactive ion etching (RIE) is performed by using the mask 101 so that the openings 22h can be formed. The opening 22h is formed at a position where the p-type semiconductor region 36 is to be formed in a post-process. That is, the opening 22h is formed in a stripe pattern so that the p-type semiconductor region 36 can be formed in a stripe pattern. The width of the opening 22h is set equal to the separation distance B (refer to FIG. 3) between adjacent p-type semiconductor regions 36 to be formed. A separation distance between adjacent openings 22h is set equal to the width A (refer to FIG. 3) of the p-type semiconductor region 36. When S30 is finished, the Schottky electrode 22 is almost completed (except its outer portion). The mask 101 is removed, after the openings 22h of the Schottky electrode layer 22f are formed.

Figure 9:
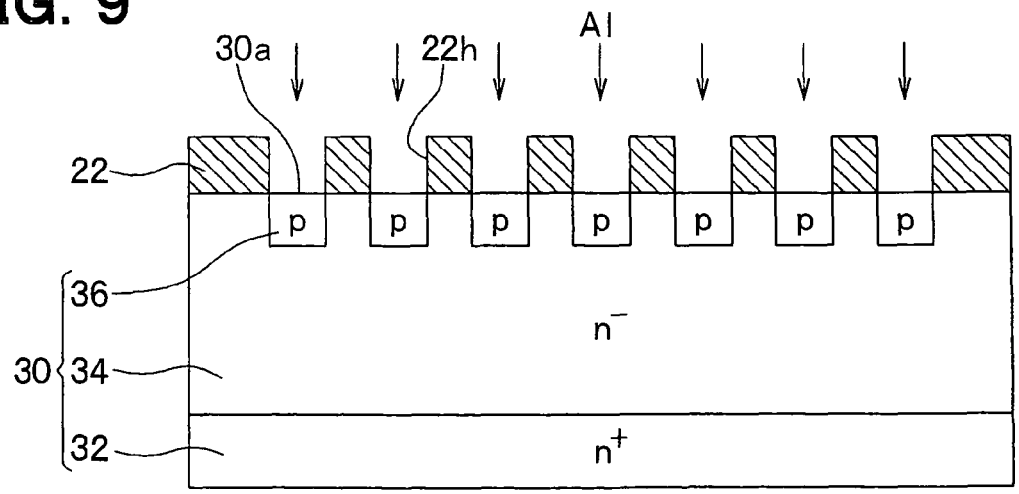
FIG. 9 is a diagram illustrating a process corresponding to S40 of the flow chart of FIG. 5.

Next, at S40, as shown in FIG. 9, a p-type impurity (aluminum) is introduced into the semiconductor substrate 30 from the top surface 30a to form the p-type semiconductor region 36. For example, the introduction of the p-type impurity into the semiconductor substrate 30 can be performed by ion implantation. The p-type impurity is introduced into the semiconductor substrate 30 through the opening 22h of the Schottky electrode 22. That is, the p-type impurity is introduced into the semiconductor substrate 30 by using the Schottky electrode 22 as a mask. In such an approach, there is no need to use additional mask to form the p-type semiconductor region 36. A region where the top surface 30a of the semiconductor substrate is exposed through the opening 22h of the Schottky electrode 22 is a region where the ohmic electrode 24 is to be formed in a post-process. Therefore, when the ion implantation of the p-type impurity into the semiconductor substrate 30 is performed by using the Schottky electrode 22 as a mask, the region where the p-type semiconductor region 36 is formed can be accurately aligned with the region where the ohmic electrode 24 is formed. If the region where the ohmic electrode 24 is formed is smaller than the region where the p-type semiconductor region 36 is formed, a contact area between the ohmic electrode 24 and the p-type semiconductor region 36 is reduced. As a result, a contact resistance is increased. Conversely, if the region where the ohmic electrode 24 is formed is larger than the region where the p-type semiconductor region 36 is formed, the ohmic electrode 24 comes into contact with the drift layer 34. As a result, a leak current is increased.

After the p-type impurity is introduced into the semiconductor substrate 30, the semiconductor substrate 30 is heated to a temperature of about 900° C. by an annealing treatment. This annealing treatment can activate the introduced p-type impurity and stabilize characteristics of the Schottky electrode 22.

Figure 10:
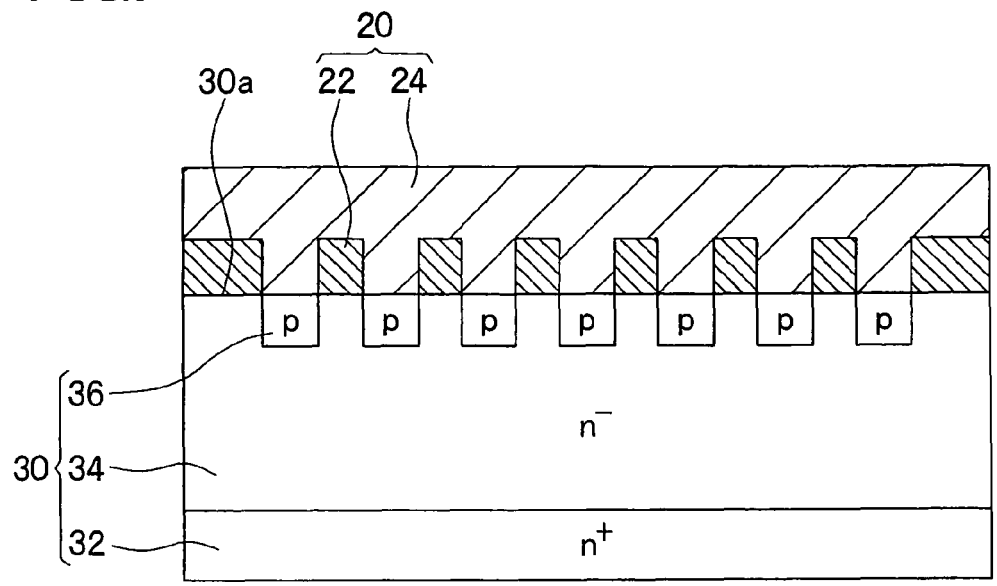
FIG. 10 is a diagram illustrating a process corresponding to S50 of the flow chart of FIG. 5.

Then, at S50, as shown in FIG. 10, the ohmic electrode 24 is formed on the top surface 30a of the semiconductor substrate 30. For example, when the ohmic electrode 24 is made of aluminum, the ohmic electrode 24 can be formed by a sputtering method. The ohmic electrode 24 is formed so that the thickness of the ohmic electrode 24 can be enough greater than the thickness of the Schottky electrode 22. Thus, the Schottky electrode 22 is almost entirely covered with the ohmic electrode 24 from above. The ohmic electrode 24 almost entirely surrounds the Schottky electrode 22 and constitutes the most part of the top electrode 20.

Figure 11:
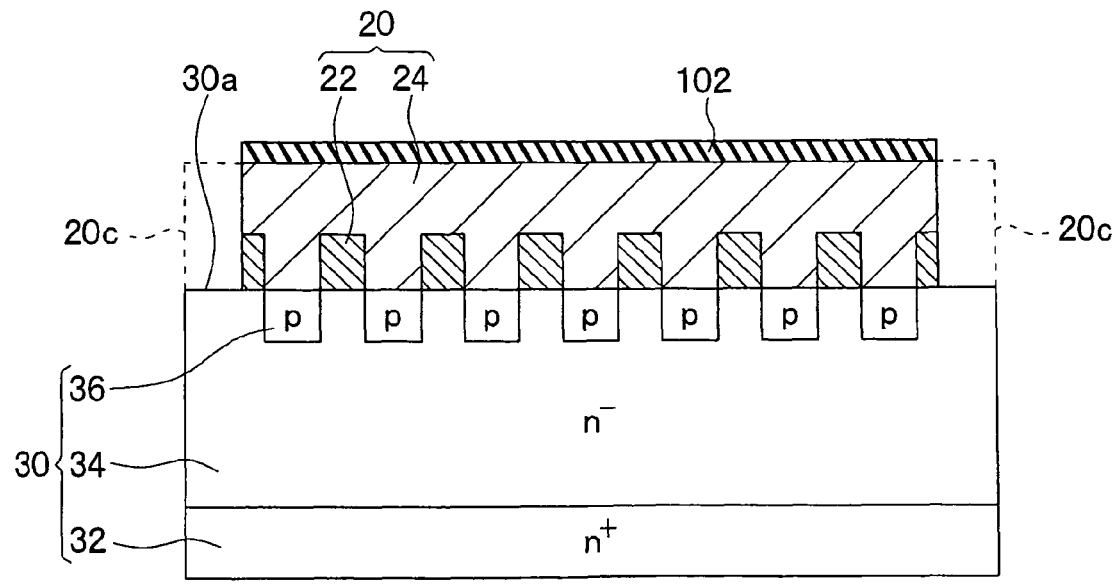
FIG. 11 is a diagram illustrating a process corresponding to S60 of the flow chart of FIG. 5.

Next, at S60, as shown in FIG. 11, an outer portion 20c of the top electrode 20 is removed to individually separate the top electrodes 20 of adjacent semiconductor devices 10 on the wafer.

Then, at S70, the bottom electrode 50 is formed. In this way, the semiconductor device 10 shown in FIG. 1 is made.

As described above, according to the first method of making the semiconductor device 10, the ohmic electrode 24 is formed later than the Schottky electrode 22. In such an approach, it is less likely that a foreign matter remains between the Schottky electrode 22 and the drift layer 34.

Here, it is assumed that the ohmic electrode 24 is formed earlier than the Schottky electrode 22. In such a case, firstly, the p-type semiconductor region 36 is formed to the semiconductor substrate 30. Then, an ohmic electrode layer (e.g., aluminum layer) is formed on the top surface 30a of the semiconductor substrate 30. Next, the ohmic electrode layer is partially removed so that the drift layer 34 can be exposed to the top surface 30a. Then, the Schottky electrode 22 is formed on an exposed surface of the drift layer 34. According to this procedure, there is a possibility that the material (e.g., aluminum) used to form the ohmic electrode 24 remains on the exposed surface of the drift layer 34. If the material used to form the ohmic electrode 24 remains on the exposed surface of the drift layer 34, the remaining material may affect Schottky contact between the Schottky electrode 22 and the drift layer 34. As a result, a problem such as an increase in leak current may occur. Using a mask for covering the exposed surface of the drift layer 34 when the ohmic electrode 24 is formed may overcome such a problem. However, this approach requires additional process for forming the mask. Further, there is a possibility that a material used to form the mask remains on the exposed surface of the drift layer 34.

According to the first method of making the semiconductor device 10, the ohmic electrode 24 is formed later than the Schottky electrode 22 to prevent a foreign matter such as the material used to form the ohmic electrode 24 from remaining between the Schottky electrode 22 and the exposed surface of the drift layer 34. In such approach, the characteristics of the Schottky electrode 22 are stabilized so that the semiconductor device 10 made by the first method can have good characteristics.

(A Second Method of Making the Semiconductor Device 10)

Figure 12:
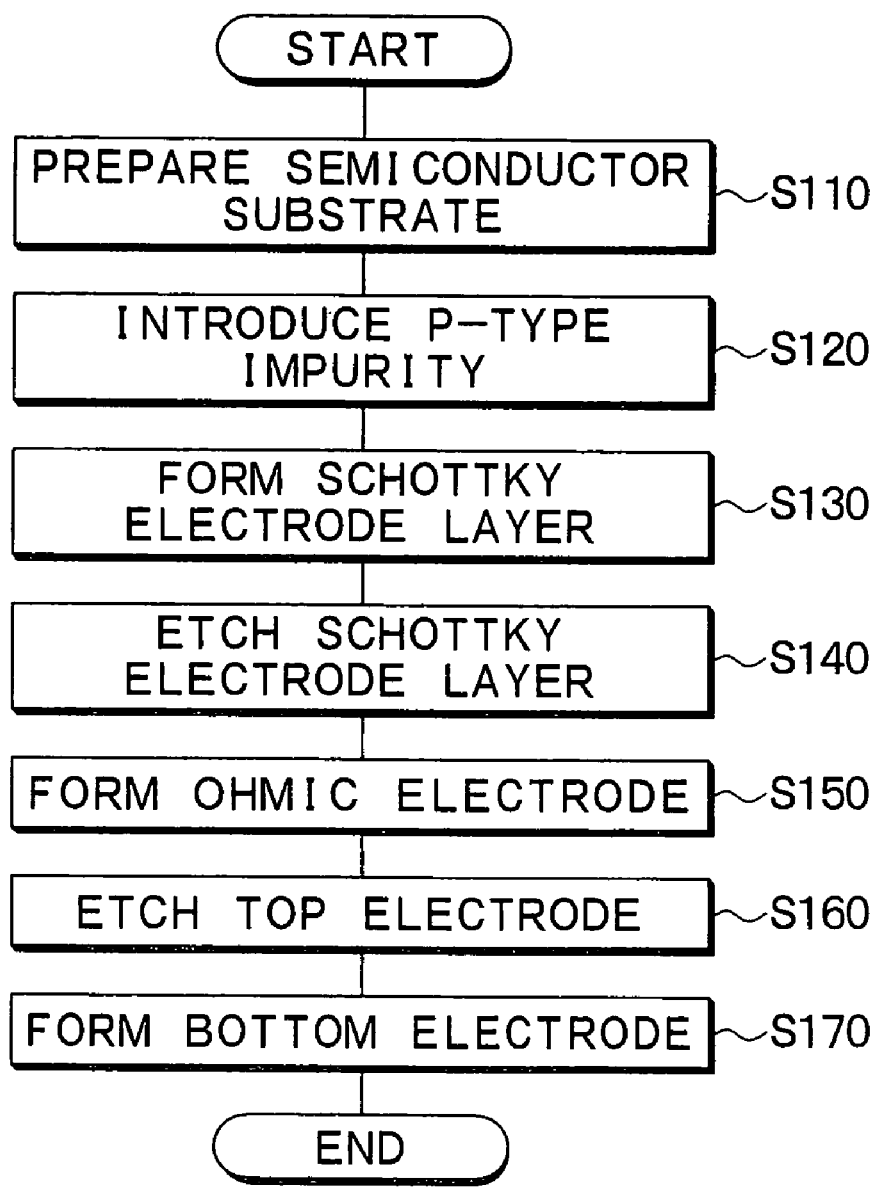
FIG. 12 is a flow chart illustrating a flow of a second method of making the semiconductor device of the first embodiment.

A second method of making the semiconductor device 10 is described below with reference to FIG. 12. FIG. 5 is a flow chart illustrating a flow of processes performed in the second method. According to the second method, multiple semiconductor devices 10 are made at once on a single wafer.

Firstly, like at S10 in the first method, the n-type semiconductor substrate 30 of silicon carbide is prepared at S110 (refer to FIG. 6).

Figure 13:
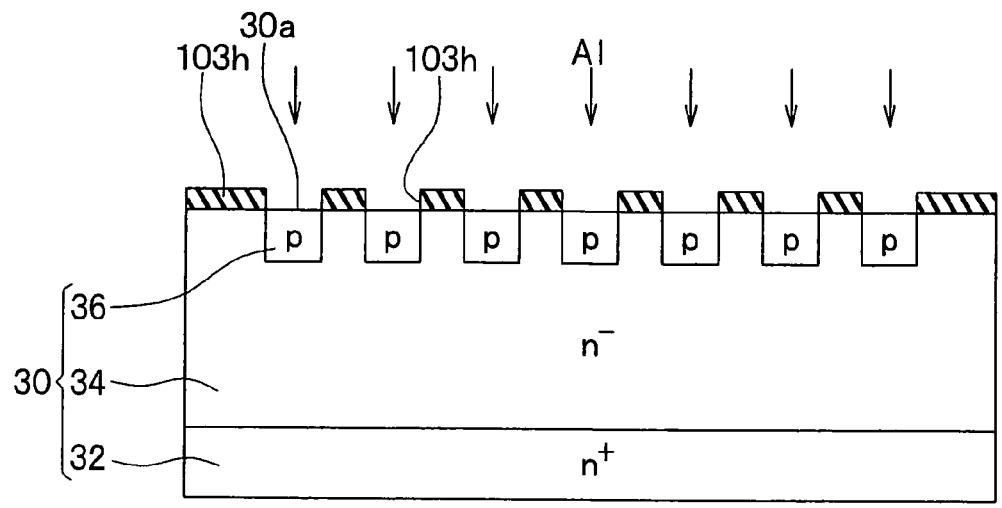
FIG. 13 is a diagram illustrating a process corresponding to S120 of the flow chart of FIG. 12.

Next, at S120, as shown in FIG. 13, a p-type impurity (e.g., aluminum) is introduced into the semiconductor substrate 30 from the top surface 30a to form the p-type semiconductor region 36. For example, the introduction of the p-type impurity into the semiconductor substrate 30 can be performed by ion implantation, after a mask 103 is formed. For example, the mask 103 can be made of SiO$_2$. The p-type impurity is introduced into the semiconductor substrate 30 through openings 103h formed in the mask 103.

Figure 14:
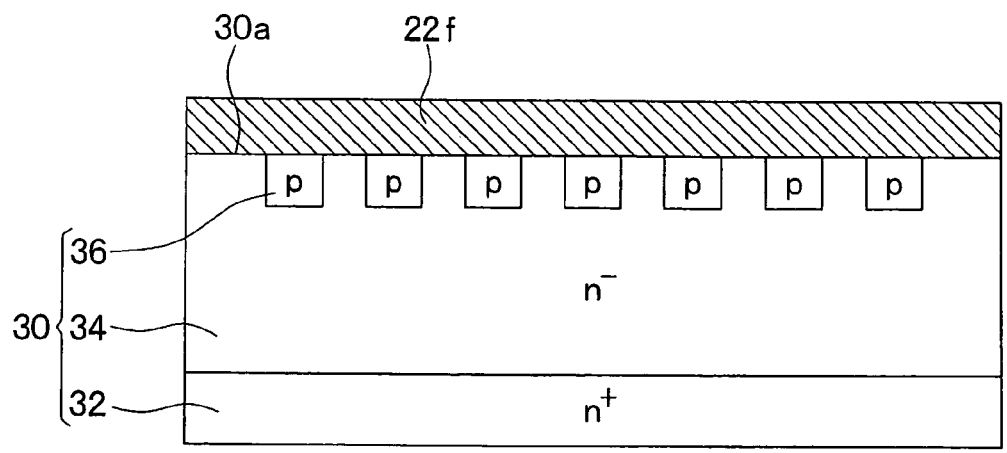
FIG. 14 is a diagram illustrating a process corresponding to S130 of the flow chart of FIG. 12.

Then, at S130, as shown in FIG. 14, the Schottky electrode layer 22f is formed on the top surface 30a of the semiconductor substrate 30. The Schottky electrode layer 22f can be formed at S130 in the same manner as at S20 of the first method.

Figure 15:
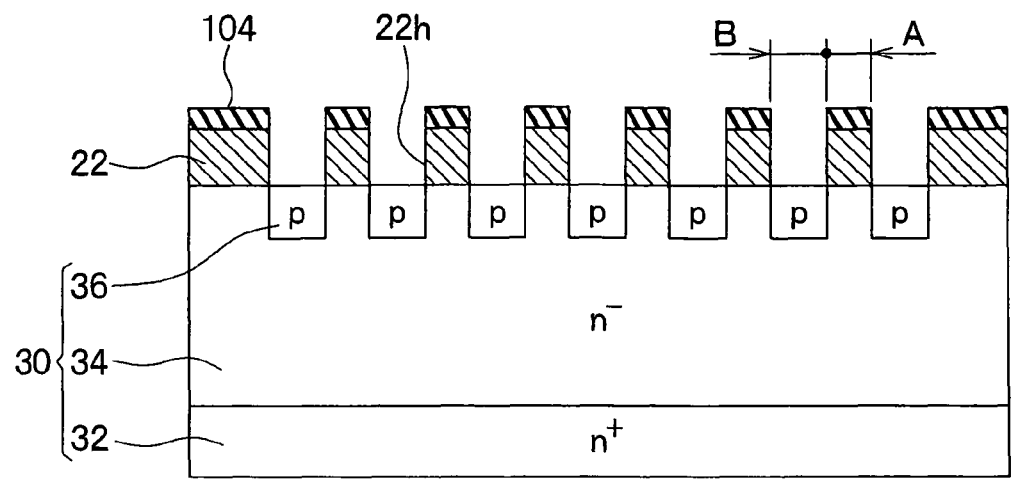
FIG. 15 is a diagram illustrating a process corresponding to S140 of the flow chart of FIG. 12.

Next, at S140, as shown in FIG. 15, the Schottky electrode layer 22f is partially removed by an etching process to form multiple openings 22h. In the etching process, a patterned mask 104 is formed by a photolithography process, and then a reactive ion etching (RIE) is performed by using the mask 104. The opening 22h is formed at a position where the p-type semiconductor region 36 is formed. That is, the opening 22h is formed in a stripe pattern so that the p-type semiconductor region 36 can be formed in a stripe pattern. The mask 104 is removed, after the opening 22h is formed.

After the p-type impurity is introduced into the semiconductor substrate 30, the semiconductor substrate 30 is heated to a temperature of about 900° C. by an annealing treatment. This annealing treatment can activate the introduced p-type impurity and stabilize the characteristics of the Schottky electrode 22.

Figure 16:
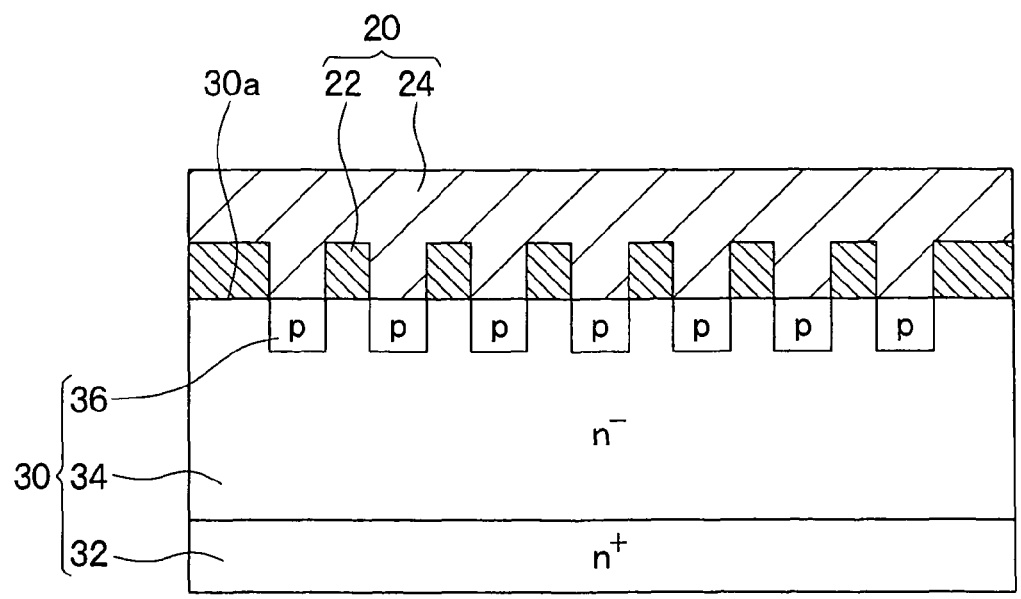
FIG. 16 is a diagram illustrating a process corresponding to S150 of the flow chart of FIG. 12.

Then, at S150, as shown in FIG. 16, the ohmic electrode 24 is formed on the top surface 30a of the semiconductor substrate 30. The ohmic electrode 24 can be formed at S150 in the same manner as at S50 of the first method.

Next, at S160, the outer portion 20c of the top electrode 20 is removed in the same manner as at S60 of the first method.

Then, at S170, the bottom electrode 50 is formed. In this way, the semiconductor device 10 shown in FIG. 1 is made.

Unlike in the first method, the p-type semiconductor region 36 is formed earlier than the Schottky electrode 22 in the second method. In this way, the semiconductor device 10 can be made by forming the Schottky electrode 22 later than the p-type semiconductor region 36. It is noted that the ohmic electrode 24 is formed later than the Schottky electrode 22 in the second method like in the first method. Therefore, it is less likely that a foreign matter such as the material used to form the ohmic electrode 24 remains between the Schottky electrode 22 and the drift layer 34.

(Second Embodiment)

A semiconductor device 110 according to a second embodiment of the present invention is described below with reference to FIG. 17. FIG. 18 is an enlarged view of a portion enclosed by the line XVIII in FIG. 17. Like the semiconductor device 10 of the first embodiment, the semiconductor device 110 is a so-called junction barrier Schottky diode (JBS) including a Schottky barrier diode section 112 and a p-n diode section 114 that are alternately arranged.

Figure 17:
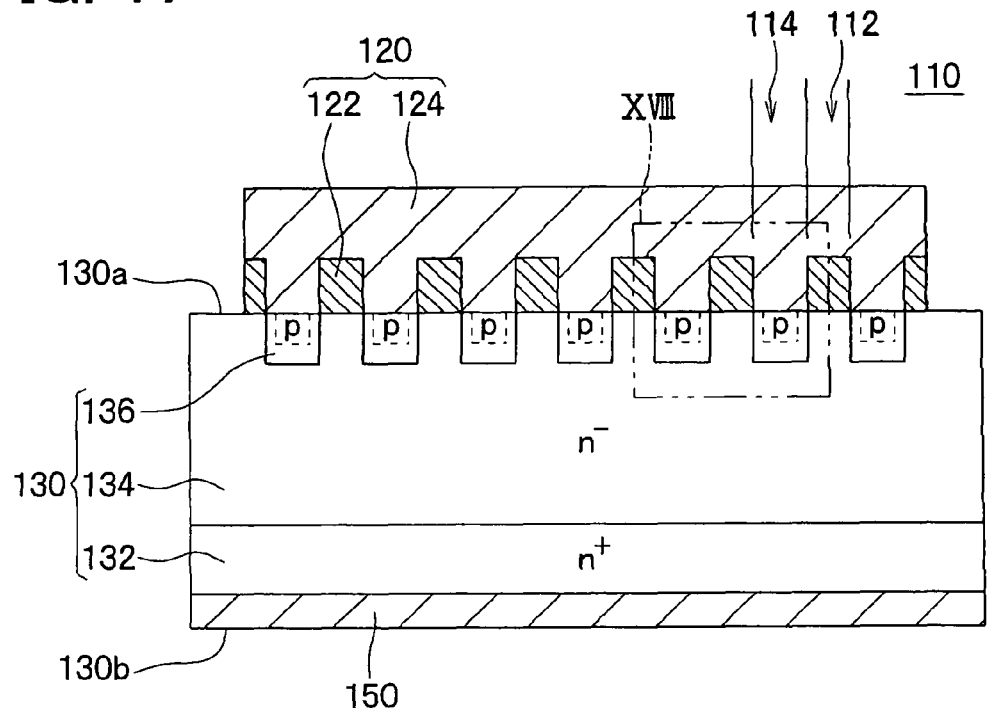
FIG. 17 is a diagram illustrating a cross-sectional view of a semiconductor device according to a second embodiment of the present invention.
Figure 18:
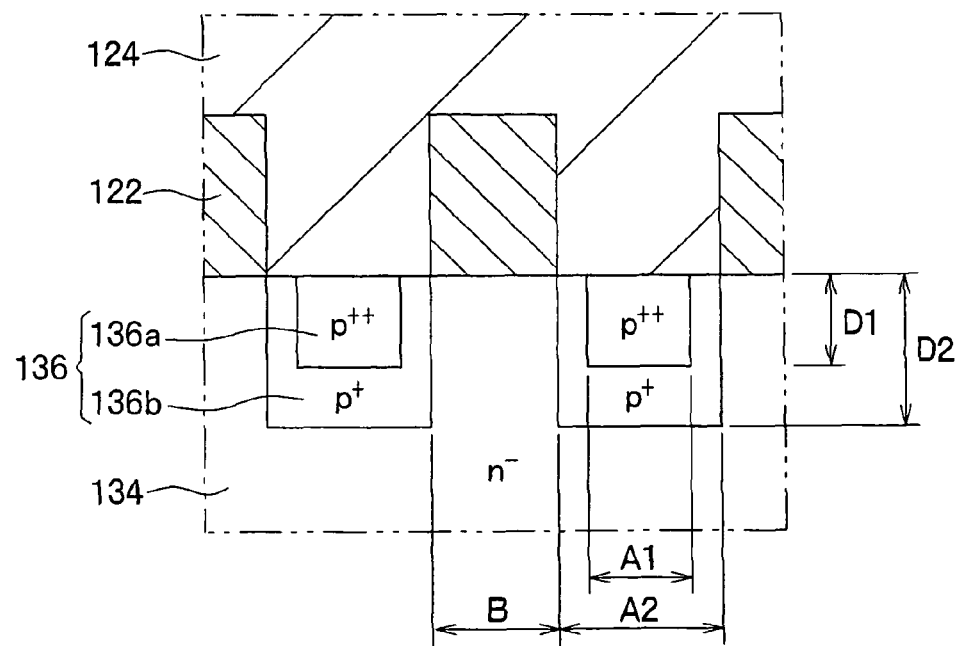
FIG. 18 is a diagram illustrating an enlarged view of a portion enclosed by the line XVIII in FIG. 17.

As can be seen by comparing FIGS. 1, 3 with FIGS. 17, 18, a difference between the first and second embodiments is a difference between the p-type semiconductor region 36 of the semiconductor device 10 and a p-type semiconductor region 136 of the semiconductor device 110. An inner structure of the p-type semiconductor region 136 is described in details below.

As shown in FIG. 18, the p-type semiconductor region 136 includes a first region 136a and a second region 136b. The first region 136a is much highly doped with a p-type impurity, and the second region 136b is highly doped with a p-type impurity. The first region 136a is doped with two kinds of p-type impurities, and the second region 136b is doped with one kind of p-type impurities. For example, the first region 136a can be doped with both aluminum and boron with a concentration of $1.0 \times 10^{20}/cm^3$, and the second region 136b can be doped with only boron with a concentration of $1.0 \times 10^{19}/cm^3$.

This inner structure of the p-type semiconductor region 136 results from the first method of making the semiconductor device 110 as described later. In view of the function of the semiconductor device 110, it is not necessarily that two kinds of p-type impurities exist in the first region 136a of the p-type semiconductor region 136. That is, each of the first and second regions 136a, 136b can be doped with only one kind of p-type impurities. As described later, in a second method of making the semiconductor device 110, each of the first and second regions 136a, 136b is doped with only one kind of p-type impurities.

The first region 136a is located substantially in a center portion of the p-type semiconductor region 136, and the second region 136b is located on an outer portion of the p-type semiconductor region 136. The first region 136a is exposed to a top surface 130a of a semiconductor substrate 130 and in ohmic contact with an ohmic electrode 124. In the semiconductor substrate 130, the first region 136a is surrounded by the second region 136b and separated from a drift layer 134. The second region 136b is located around the first region 136a and located adjacent to the drift layer 134. Further, the second region 136b is exposed to the top surface 130a of the semiconductor substrate 130 and in ohmic contact with the ohmic electrode 124.

For example, a width A1 of the first region 136a can be 1 μm, and a thickness (i.e., depth from the top surface 130a) D1 of the first region 136a can be 0.7 μm. For example, a width A2 of the second region 136b can be 2 μm, and a thickness (i.e., depth from the top surface 130a) D2 of the second region 136b can be 1.5 μm. In this case, a separation distance B between adjacent p-type semiconductor regions 136 can be 1.4 μm, for example.

As described above, the p-type semiconductor region 136 of the second embodiment includes the first region 136a that is much highly doped with a p-type impurity and in ohmic contact with the ohmic electrode 124. As the impurity concentration of the p-type semiconductor region 136 is higher, ohmic contact between the p-type semiconductor region 136 and the ohmic electrode 124 becomes better. Therefore, good ohmic contact between the p-type semiconductor region 136 and the ohmic electrode 124 can be achieved by the first region 136a that is much highly doped with a p-type impurity.

By the way, when the first region 136a is much highly doped with a p-type impurity, it may be likely that a crystal defect occurs in the first region 136a. If such a defect occurs at a boundary surface between the p-type semiconductor region 136 and the drift layer 134, a leak current in the p-n diode section 114 is increased. As a result, a performance of the semiconductor device 110 is significantly degraded. However, the impurity concentration of the second region 136b located between the first region 136a and the drift layer 134 is lower than the impurity concentration of the first region 136a. That is, the impurity concentration of the p-type semiconductor region 136 is kept relatively low at the boundary surface. Accordingly, such a crystal defect is less likely to occur at the boundary surface. Thus, an increase in leak current in the p-n diode section 114 can be prevented.

(A First Method of Making the Semiconductor Device 110)

Figure 19:
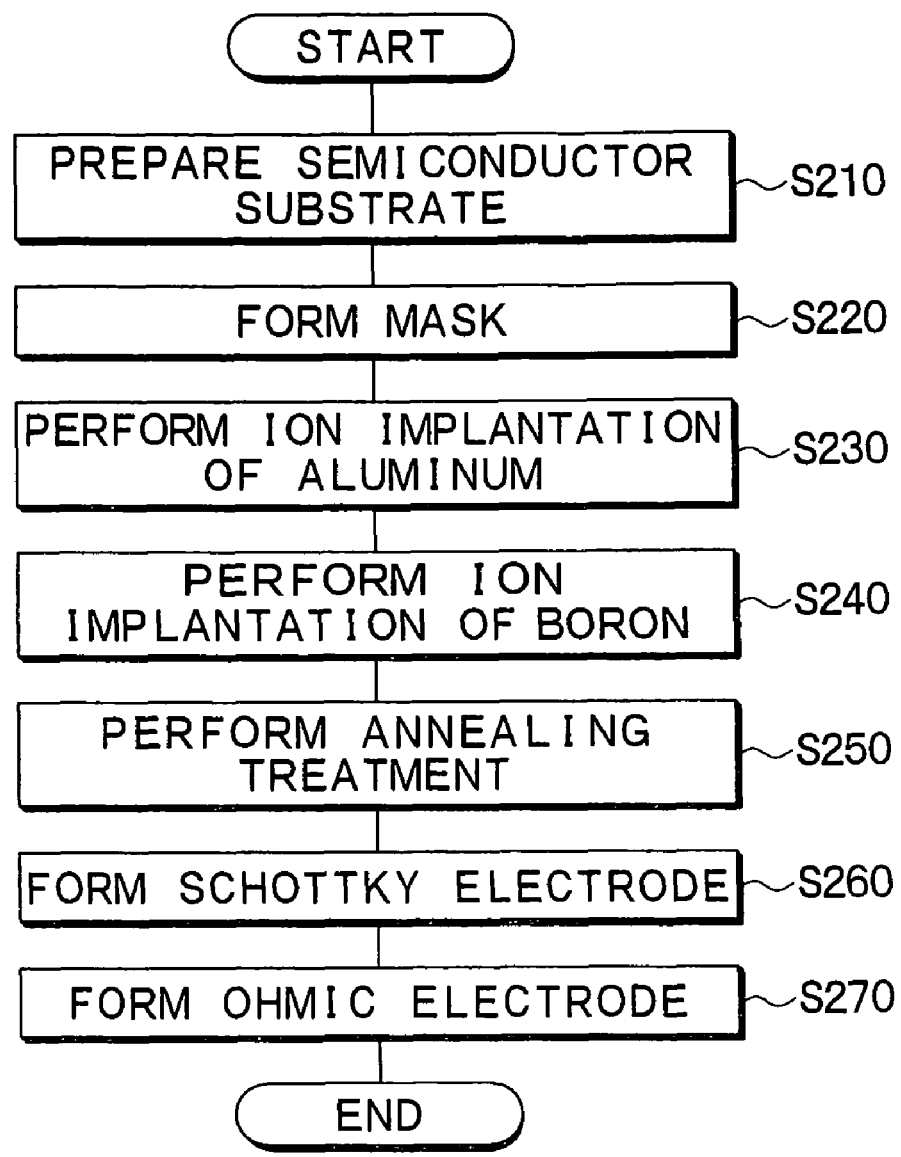
FIG. 19 is a flow chart illustrating a flow of a first method of making the semiconductor device of the second embodiment.

The first method of making the semiconductor device 110 is described below with reference to FIG. 19. FIG. 19 is a flow chart showing the flow of processes performed in the first method. According to the first method, multiple semiconductor devices 110 are made at once on a single wafer.

Figure 20:
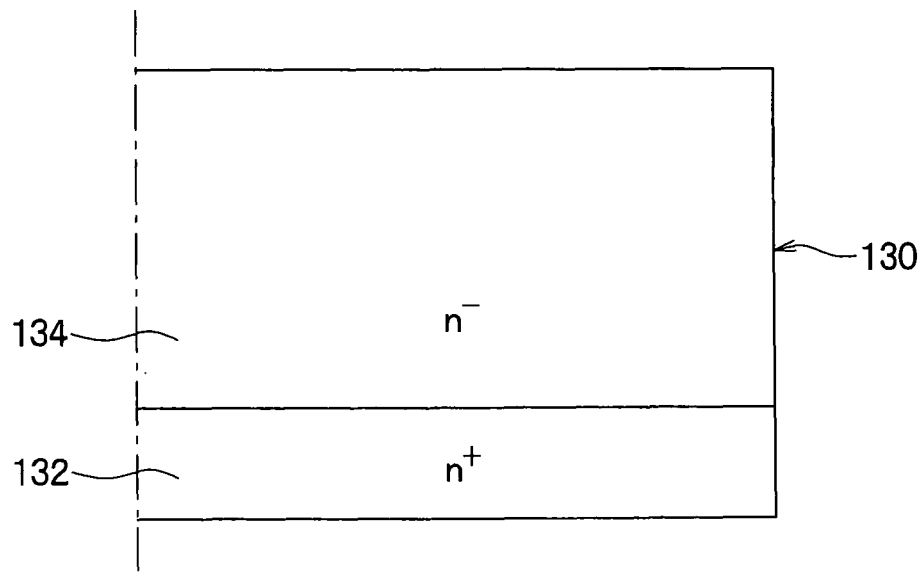
FIG. 20 is a diagram illustrating a process corresponding to S210 of the flow chart of FIG. 19.

Firstly, at S210, as shown in FIG. 20, the n-type semiconductor substrate 130 of silicon carbide is prepared. It is preferable that the semiconductor substrate 130 have a hexagonal crystal structure such as a 4H structure or a 6H structure. A contact layer 132 doped with a high concentration of an n-type impurity and the drift layer 134 doped with a low concentration of an n-type impurity are preformed in the semiconductor substrate 130. A method of making the semiconductor substrate 130 is not limited to a specific method. In the second embodiment, an n-type silicon carbide wafer (with a 4H structure) as the contact layer 132 is prepared, and the drift layer 134 is epitaxially grown on the n-type silicon carbide wafer so that the semiconductor substrate 130 can be made. In the second embodiment, an impurity concentration of the silicon carbide wafer is $5\times10^{18}/cm^3$, an impurity concentration of the drift layer 134 is $5\times10^{15}/cm^3$, and the drift layer 134 is grown to the thickness of 13 µm.

Figure 21:
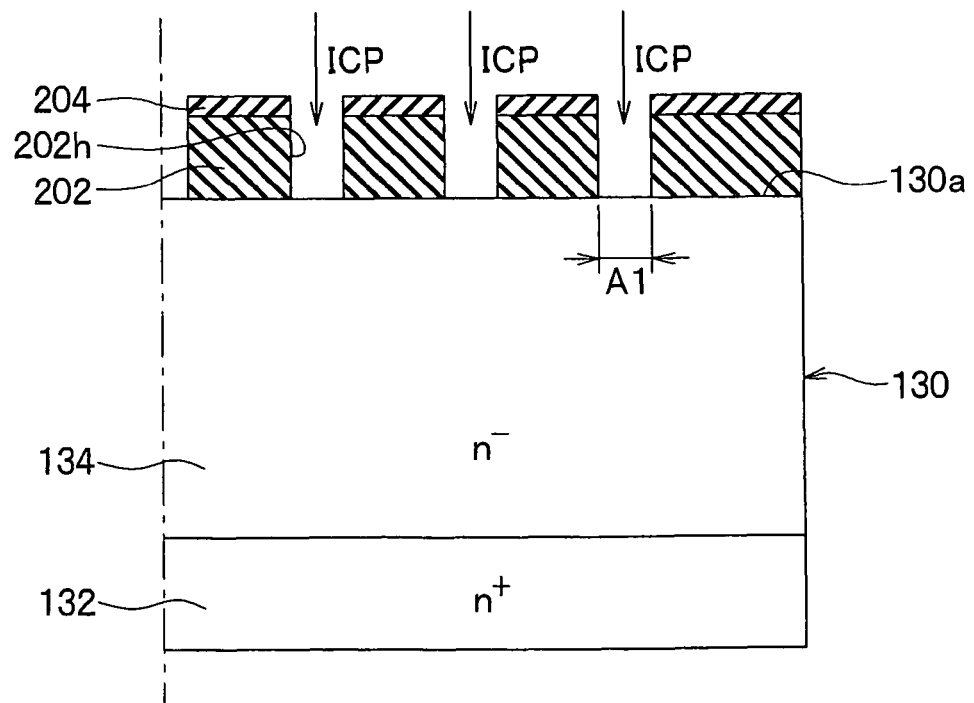
FIG. 21 is a diagram illustrating a process corresponding to S220 of the flow chart of FIG. 19.

Next, at S220, as shown in FIG. 21, a mask 202 having multiple openings 202h are formed on the top surface 130a of the semiconductor substrate 130. For example, the mask 202 can be formed by patterning a silicon oxide layer with a thickness of 2.5 µm by a ICP etching method using a photoresist 204. The opening 202h is formed to match the shape of the first region 136a to be formed. For example, the width of the opening 202h is set approximately equal to the width A1 of the first region 136a.

Figure 22:
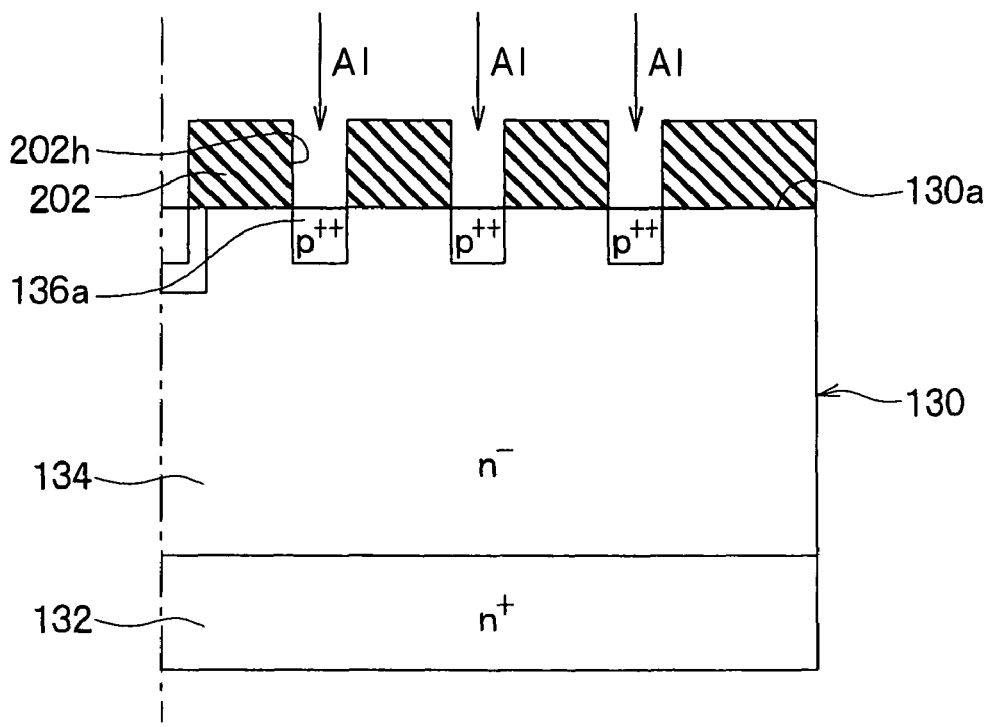
FIG. 22 is a diagram illustrating a process corresponding to S230 of the flowchart of FIG. 19.

Then, at S230, as shown in FIG. 22, ion implantation of aluminum as a p-type impurity into the semiconductor substrate 130 is performed through the opening 202h of the mask 202. A region where aluminum is implanted is set substantially equal to a region where the first region 136a is to be formed. A concentration of aluminum to be implanted is adjusted according to a concentration of the first region 136a to be formed. In the first method, the concentration of aluminum can be $1.0\times10^{20}/cm^3$, for example.

Figure 23:
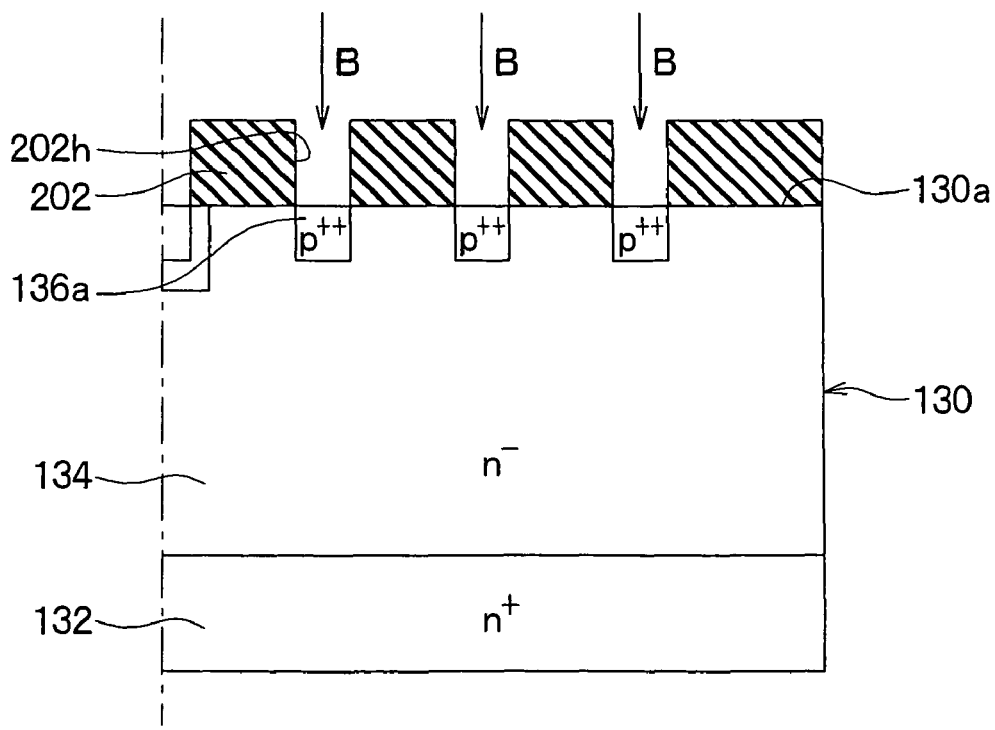
FIG. 23 is a diagram illustrating a process corresponding to S240 of the flowchart of FIG. 19.

Next, at S240, as shown in FIG. 23, ion implantation of boron a p-type impurity into the semiconductor substrate 130 is performed through the opening 202h of the same mask 202. A region where boron is implanted is set substantially equal to the region where the first region 136a is to be formed. That is, the region where boron is implanted is substantially equal to the region where aluminum is implanted. A concentration of boron to be implanted is adjusted according to a concentration of the second region 136b to be formed. In the first method, the concentration of boron can be $1.0\times10^{19}/cm^3$, for example. After the ion implantation of boron is finished, the mask 202 is removed, for example, by a hydrofluoric acid treatment.

Figure 24:
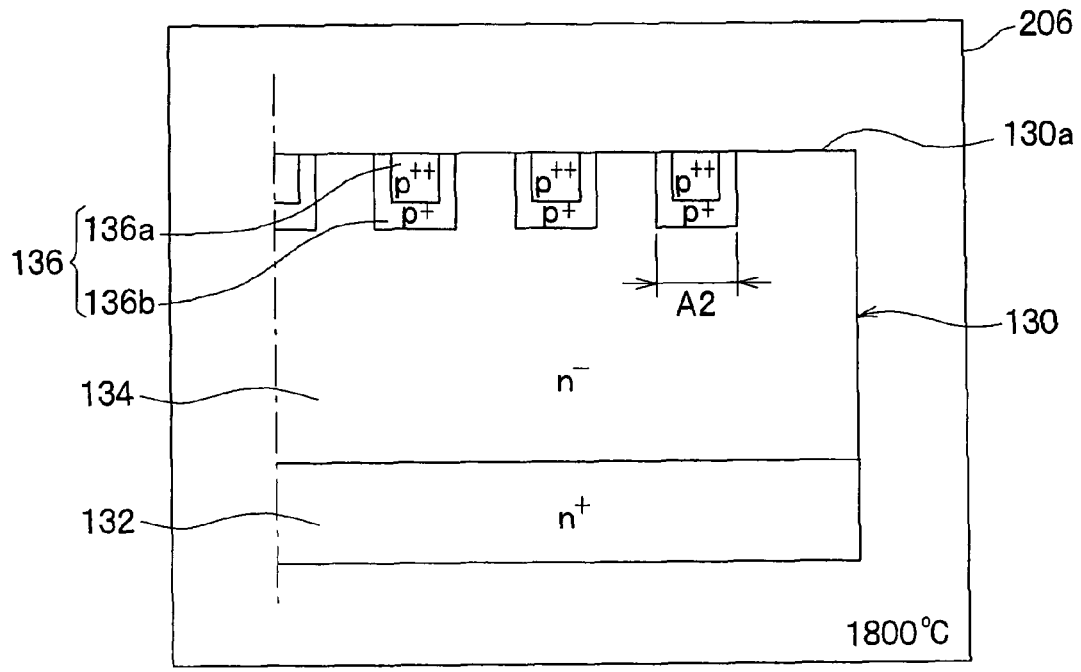
FIG. 24 is a diagram illustrating a process corresponding to S250 of the flow chart of FIG. 19.

Then, at S250, as shown in FIG. 24, the semiconductor substrate 130 is subjected to an annealing treatment using a thermal treatment machine 206. For example, the annealing treatment can be performed at a temperature of 1500° C. The annealing treatment activates and thermally diffuses the implanted aluminum and boron.

Aluminum and boron are different kinds of p-type impurities and have different thermal diffusion coefficients. Specifically, in silicon carbide, boron has a diffusion coefficient of $2.5\times10^{-13} cm^2/sec$, and aluminum has a diffusion coefficient of $3.0\times10^{-14} cm^2/sec$. That is, the diffusion coefficient of boron is enough (i.e., more than ten times) greater than the diffusion coefficient of aluminum. Accordingly, an area over which boron is thermally diffused is wider than an area over which aluminum is thermally diffused. As a result, the region where both boron and aluminum are implanted includes both boron and aluminum and becomes the first region 136a doped with a relatively high concentration of a p-type impurity. Further, only boron is further thermally diffused around the first region 136a so that the second region 136b doped with a relatively low concentration of a p-type impurity can be formed.

In this way, using two kinds of p-type impurities having different diffusion coefficients allows the first and second regions 136a, 136b having different impurity concentrations to be formed by the common mask 202. In the first method of making the semiconductor device 110, boron and aluminum are used. However, a combination of p-type impurities having different diffusion coefficients is not limited to a combination of boron and aluminum. In the first method, aluminum having a lower diffusion coefficient is implanted earlier than boron having a higher diffusion coefficient. Alternatively, a p-type impurity having a lower diffusion coefficient can be implanted later than or at the same time as a p-type impurity having a higher diffusion coefficient.

Figure 25:
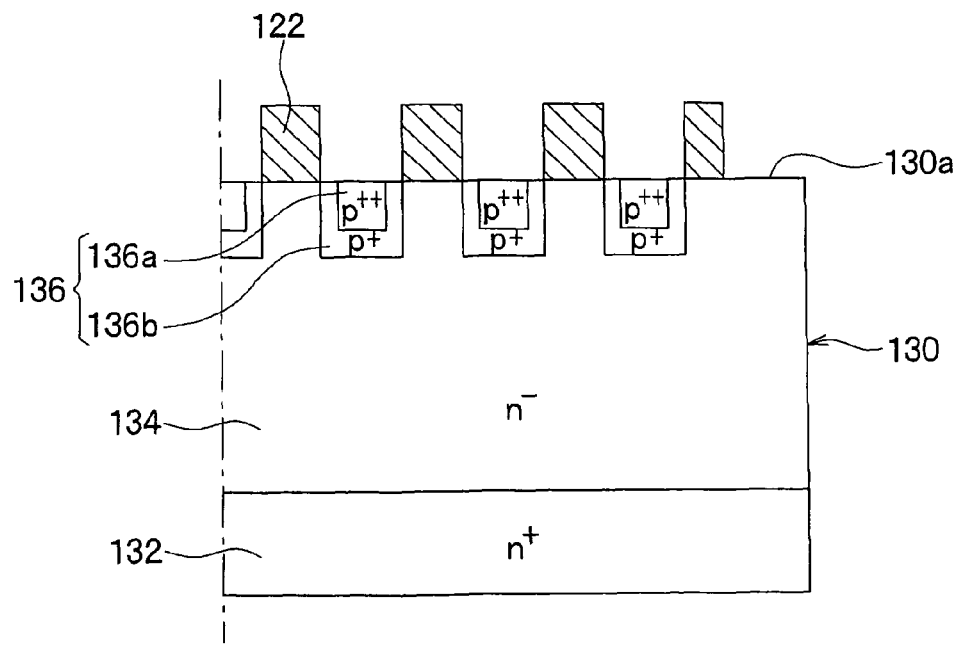
FIG. 25 is a diagram illustrating a process corresponding to S260 of the flow chart of FIG. 19.

Next, at S260, as shown in FIG. 25, a Schottky electrode 122 is formed on the top surface 130a of the semiconductor substrate 130. Like in the first embodiment, the Schottky electrode 122 can be made of molybdenum, for example. It is preferable that the Schottky electrode 122 be subjected to an annealing treatment to stabilize characteristics of the Schottky electrode 122.

Figure 26:
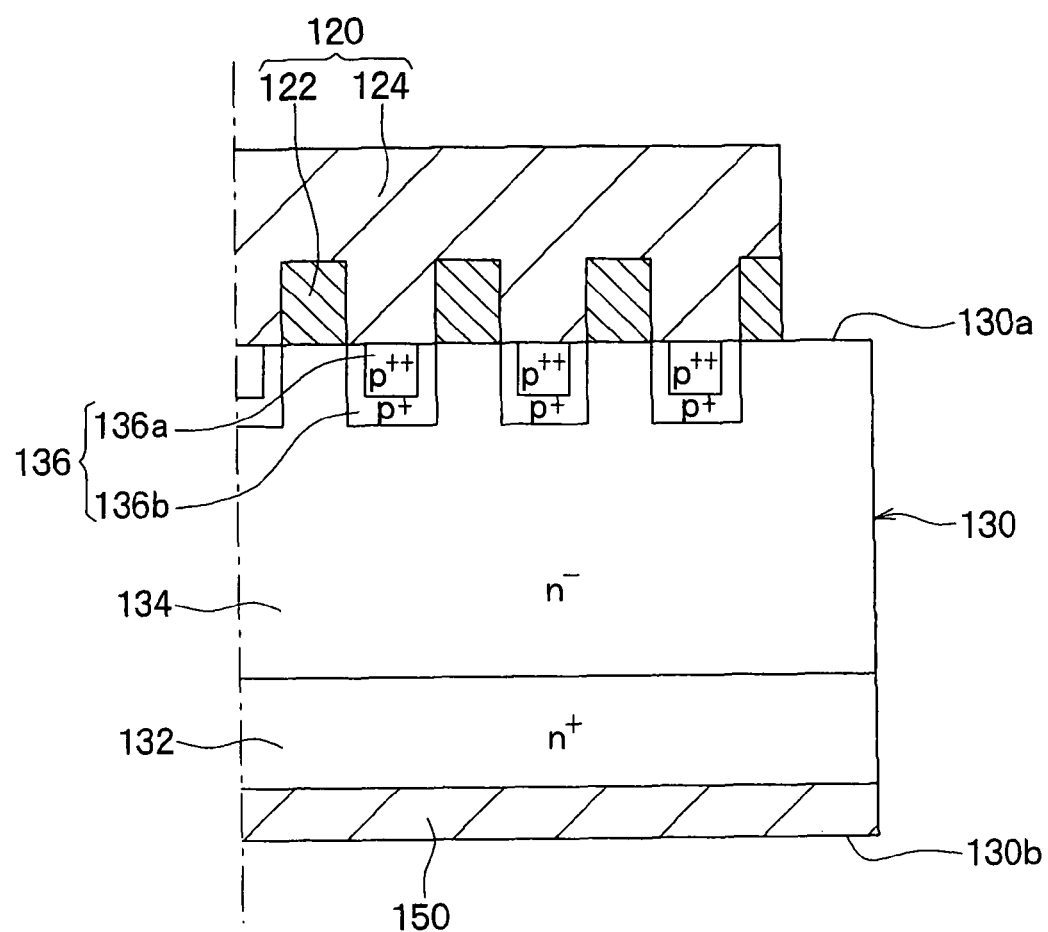
FIG. 26 is a diagram illustrating a process corresponding to S270 of the flow chart of FIG. 19.

Then, at S270, as shown in FIG. 26, the ohmic electrode 124 is formed on the top surface 130a of the semiconductor substrate 130. Further, a bottom electrode 150 is formed on a bottom surface 130b of the semiconductor substrate 130. The ohmic electrode 124 and the bottom electrode 150 can be made of aluminum, for example. The ohmic electrode 124 is formed such that the thickness of the ohmic electrode 124 can be enough greater than the thickness of the Schottky electrode 122. Thus, the ohmic electrode 124 covers the Schottky electrode 122 from side and above so that the Schottky electrode 122 can be substantially entirely covered with the ohmic electrode 124.

Finally, an annealing treatment is performed to stabilize characteristics of the Schottky electrode 122 and the ohmic electrode 124. In this way, the semiconductor device 110 of the second embodiment is made.

As described above, according to the first method of making the semiconductor device 110, the difference in impurity concentration between the center portion (i.e., first region 136a) and the outer portion (second region 136b) of the p-type semiconductor region 136 is achieved by using the difference in the diffusion coefficient between two kinds of impurities implanted to form the p-type semiconductor region 136. In such an approach, the first and second regions 136a, 136b can be formed by using the common mask 202. Therefore, there is no need to prepare two masks to form the first and second regions 136a, 136b, respectively.

(A Second Method of Making the Semiconductor Device 110)

Figure 27:
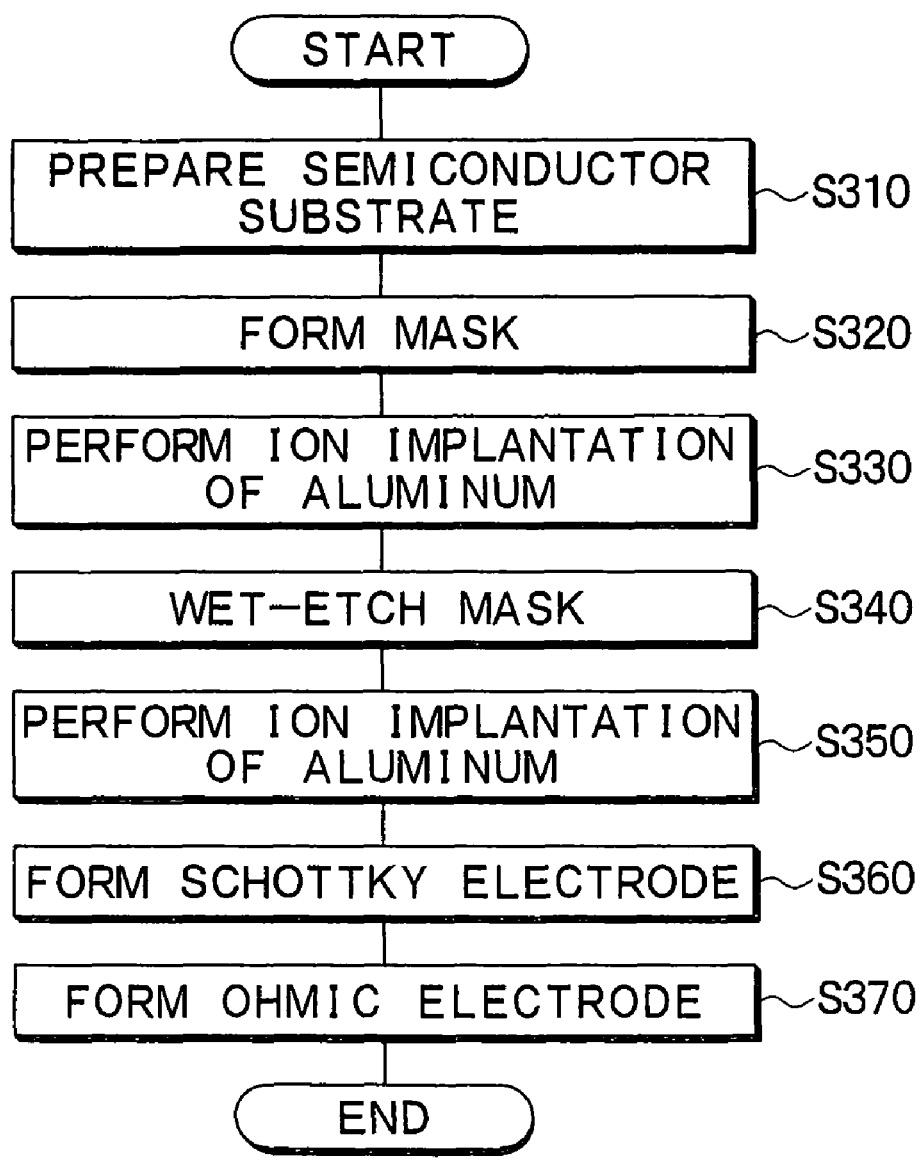
FIG. 27 is a flow chart illustrating a flow of a second method of making the semiconductor device of the second embodiment.

A second method of making the semiconductor device 110 is described below with reference to FIG. 27. FIG. 27 is a flow chart showing the flow of processes performed in the second method. According to the second method, multiple semiconductor devices 110 are made at once on a single wafer.

Figure 28:
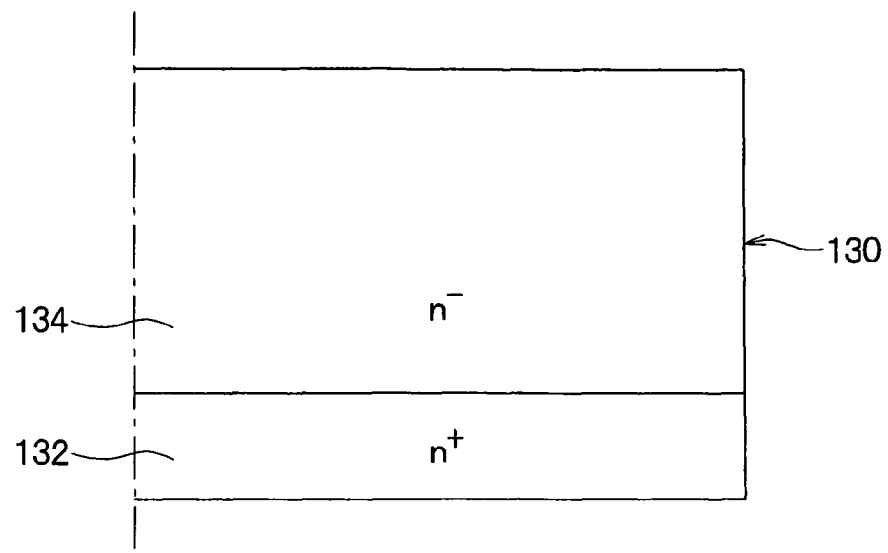
FIG. 28 is a diagram illustrating a process corresponding to S310 of the flow chart of FIG. 27.

Firstly, at S310, as shown in FIG. 28, the n-type semiconductor substrate 130 of silicon carbide is prepared. The semiconductor substrate 130 can be prepared at S310 in the same manner as at S210 of the first method.

Figure 29:
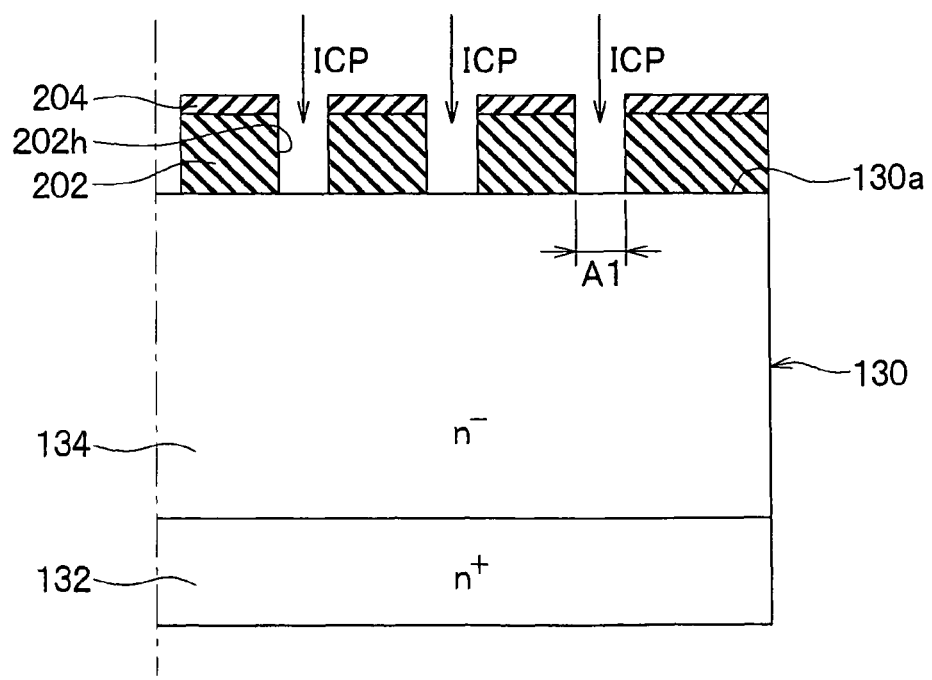
FIG. 29 is a diagram illustrating a process corresponding to S320 of the flow chart of FIG. 27.

Next, at S320, as shown in FIG. 29, the mask 202 having multiple openings 202h are formed on the top surface 130a of the semiconductor substrate 130 in the same manner at S220 of the first method. That is, the mask 202 can be formed by patterning a silicon oxide layer with a thickness of 2.5 μm by a ICP etching method using the photoresist 204. The opening 202h is formed to match the shape of the first region 136a to be formed.

Figure 30:
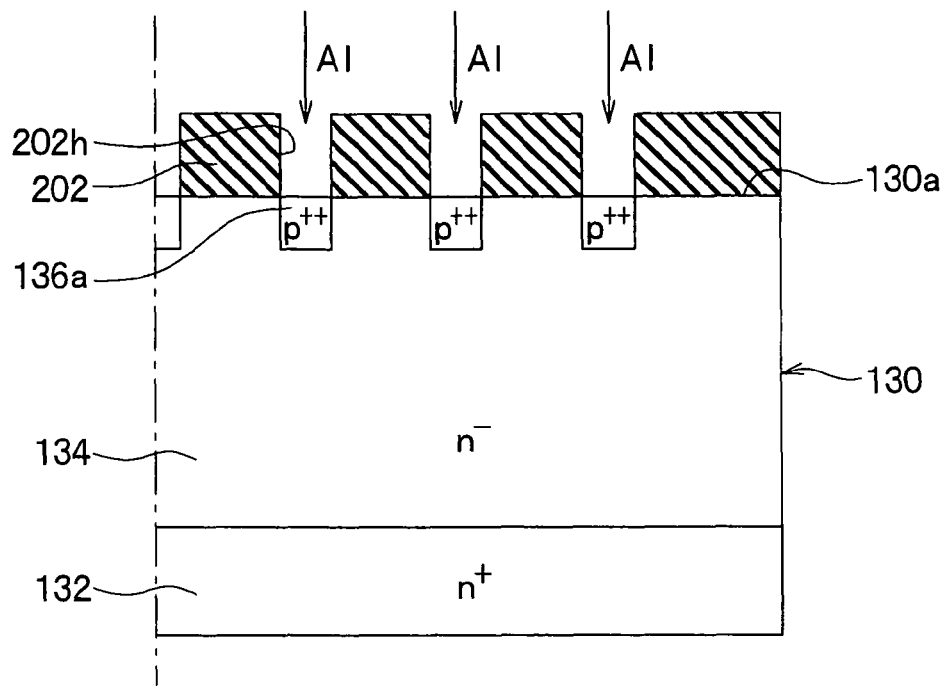
FIG. 30 is a diagram illustrating a process corresponding to S330 of the flow chart of FIG. 27.

Then, at S330, as shown in FIG. 30, ion implantation of aluminum as a p-type impurity into the semiconductor substrate 130 is performed through the opening 202h of the mask 202. A region where aluminum is implanted is set substantially equal to a region where the first region 136a is to be formed. A concentration of aluminum to be implanted is adjusted according to a concentration of the first region 136a to be formed. For example, the concentration of aluminum can be $1.0 \times 10^{20}/cm^3$. Alternatively, a p-type impurity other than aluminum can be used at S330.

Figure 31:
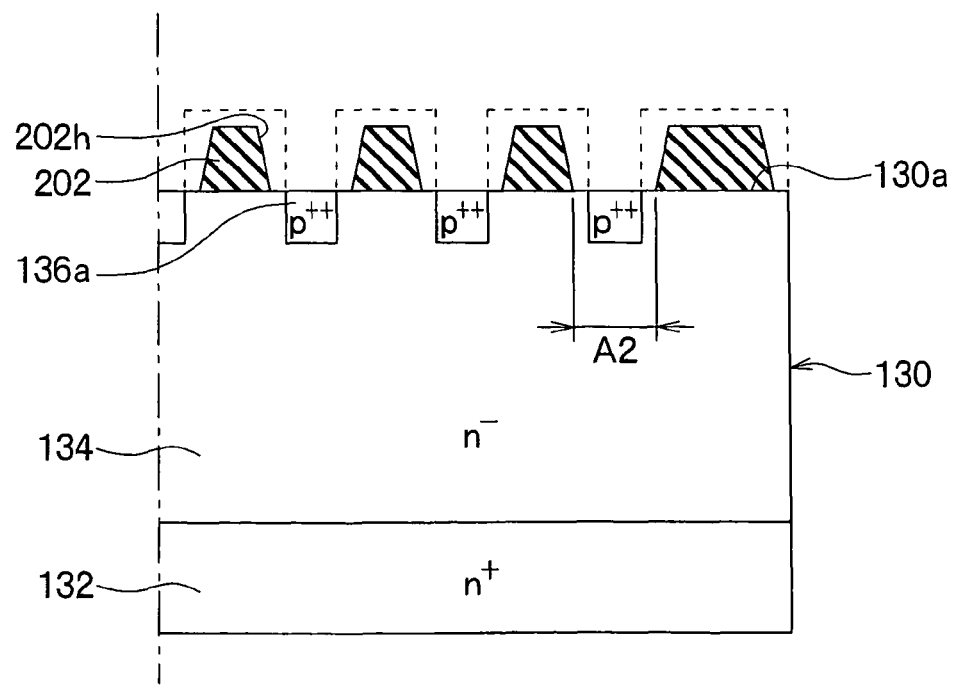
FIG. 31 is a diagram illustrating a process corresponding to S340 of the flow chart of FIG. 27.

Next, at S340, as shown in FIG. 31, the mask 202 is subjected to isotropic wet etching so that the opening 202h of the mask 202 can be enlarged. Specifically, the isotropic wet etching enlarges the opening 202h of the mask 202 by partially removing the mask 202 from a surface side of the mask 202 without entirely removing the mask 202. The opening 202h of the mask 202 is enlarged to a size corresponding to the p-type semiconductor region 136 including the second region 136b. That is, the wet etching of the mask 202 is continued until the width of the opening 202h becomes substantially equal to a width A2 of the second region 136b. It is noted that the opening 202h is enlarged by the wet etching not only in its width direction but also in its length direction.

An etchant used in the wet etching can be selected according to the material of which the mask 202 is made. For example, when the mask 202 is made of silicon oxide, it is preferable that hydrofluoric acid be used as an etchant for the wet etching. It is noted that an etching method other than wet etching can be employed at S340 as long as the etching method can isotropically etch the mask 202. For example, at S340, the mask 202 can be subjected to dry etching that uses reactive gas.

Figure 32:
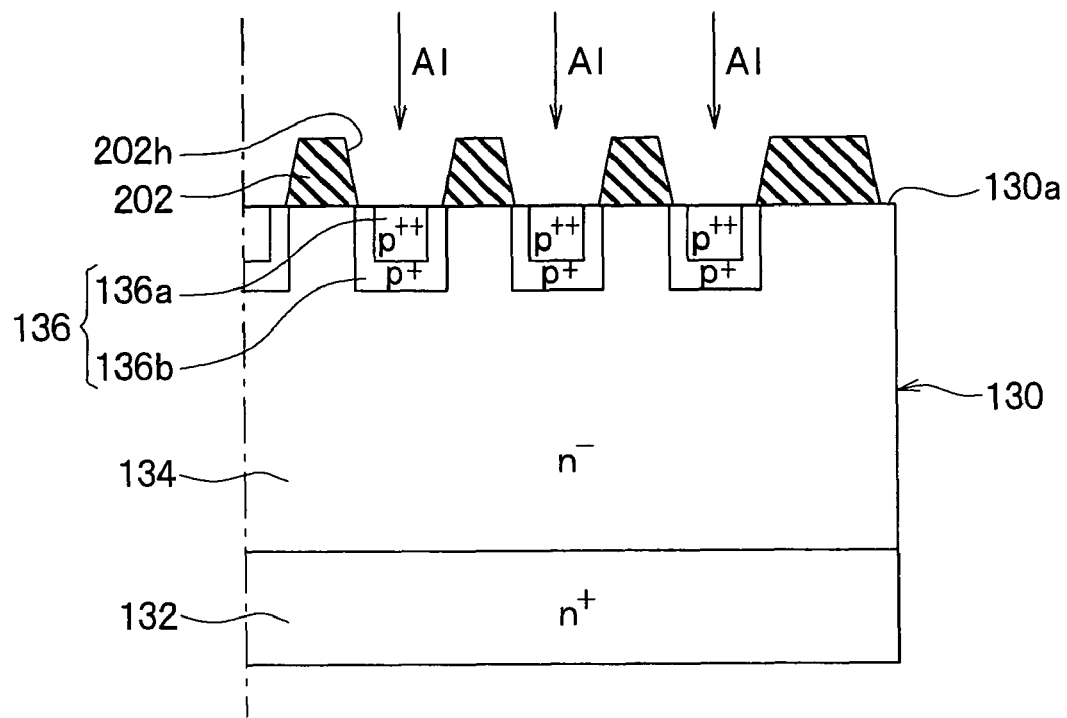
FIG. 32 is a diagram illustrating a process corresponding to S350 of the flow chart of FIG. 27.

Then, at S350, as shown in FIG. 32, ion implantation of aluminum as a p-type impurity into the semiconductor substrate 130 is performed through the enlarged opening 202h of the mask 202. A region where aluminum is implanted is set substantially equal to a region where the entire p-type semiconductor region 136 including the second region 136b is to be formed. A concentration of aluminum to be implanted is adjusted according to a concentration of the second region 136b to be formed. For example, the concentration of aluminum can be $1.0 \times 10^{19}/cm^3$. Alternatively, a p-type impurity other than aluminum can be used at S350. The p-type impurities used at S330 and S350 can be the same kind or different kinds.

Next, the semiconductor substrate 130 is subjected to an annealing treatment so that the implanted aluminum can be activated and diffused in the semiconductor substrate 130. As a result, multiple p-type semiconductor regions 136 are formed in the semiconductor substrate 130. The introduction of aluminum is performed twice in a portion of the p-type semiconductor region 136 so that the first region 136a doped with a higher concentration of aluminum can be formed. The introduction of aluminum is performed only once in a portion around the first region 136a so that the second region 136b doped with a lower concentration of aluminum can be formed around the first region 136a.

Figure 33:
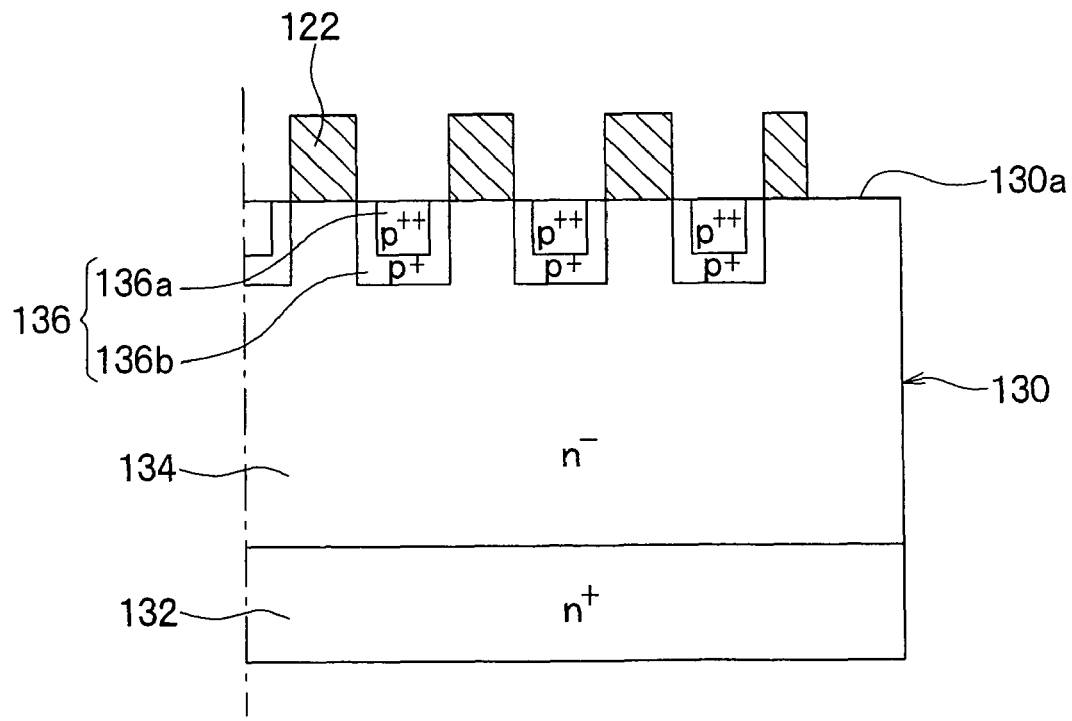
FIG. 33 is a diagram illustrating a process corresponding to S360 of the flow chart of FIG. 27.

Then, at S360, as shown in FIG. 33, the Schottky electrode 122 is formed on the top surface 130a of the semiconductor substrate 130. Like in the first embodiment, the Schottky electrode 122 can be made of molybdenum, for example. It is preferable that the Schottky electrode 122 be subjected to an annealing treatment to stabilize the characteristics of the Schottky electrode 122.

Figure 34:
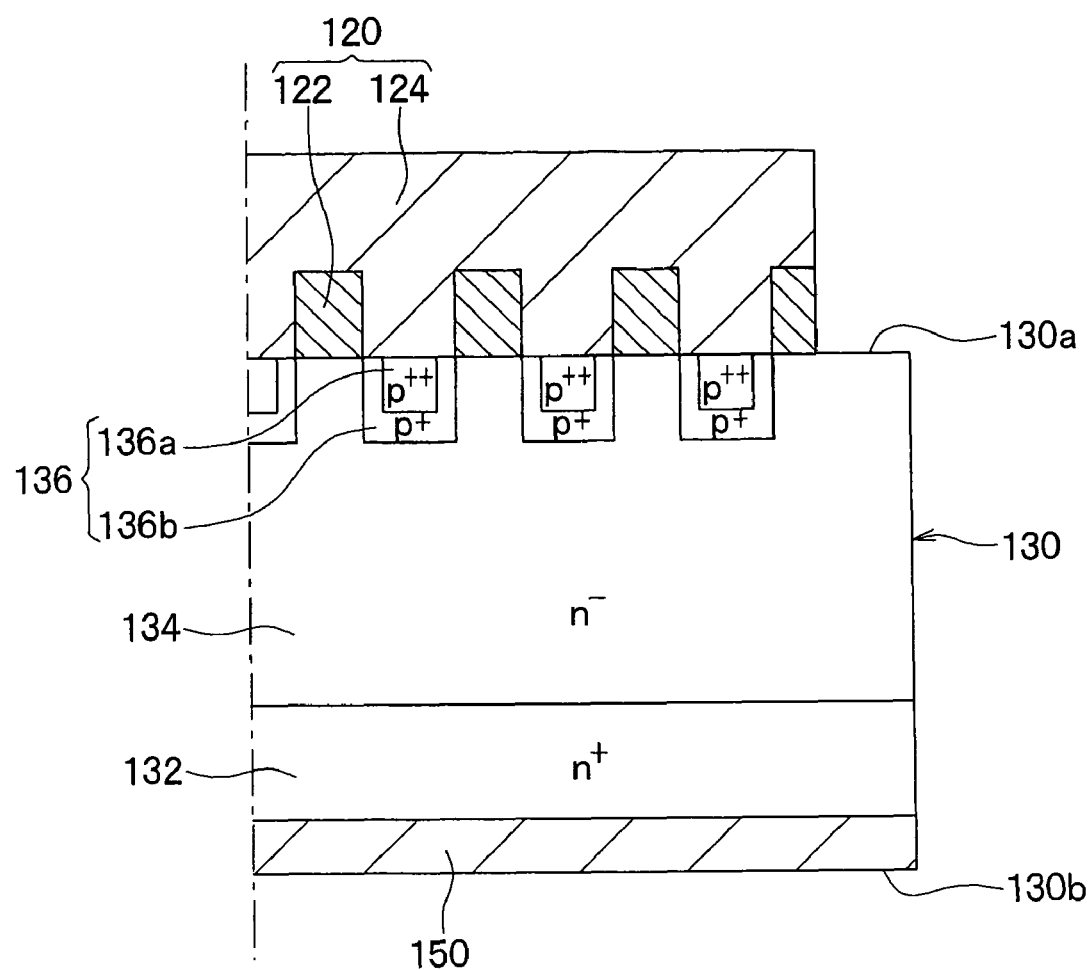
FIG. 34 is a diagram illustrating a process corresponding to S370 of the flow chart of FIG. 27.

Next, at S370, as shown in FIG. 34, the ohmic electrode 124 is formed on the top surface 130a of the semiconductor substrate 130. Further, the bottom electrode 150 is formed on the bottom surface 130b of the semiconductor substrate 130. The ohmic electrode 124 and the bottom electrode 150 can be made of aluminum, for example. The ohmic electrode 124 is formed such that the thickness of the ohmic electrode 124 can be enough greater than the thickness of the Schottky electrode 122. Thus, the ohmic electrode 124 covers the Schottky electrode 122 from side and above so that the Schottky electrode 122 can be substantially entirely covered with the ohmic electrode 124.

Finally, an annealing treatment is performed to stabilize characteristics of the Schottky electrode 122 and the ohmic electrode 124. In this way, the semiconductor device 110 of the second embodiment is made.

As described above, according to the second method of making the semiconductor device 110, the difference in impurity concentration between the center portion (i.e., first region 136a) and the outer portion (second region 136b) of the p-type semiconductor region 136 is achieved by performing ion implantation of aluminum twice while changing the region where aluminum is implanted. It is noted that the mask 202 used in the first ion implantation is used again in the second ion implantation by processing the mask 202. In such an approach, there is no need to remove the mask 202 after the first ion implantation, and also there is no need to form a new mask for the second ion implantation.

(Modifications)

The embodiments described above can be modified in various ways. Such changes and modifications are to be understood as being within the scope of the present invention as defined by the appended claims.

What is claimed is:

1. A method of making a semiconductor device comprising:
   forming a p-type semiconductor region to an n-type semiconductor substrate of silicon carbide (SiC) in such a manner that the p-type semiconductor region is partially exposed to a top surface of the semiconductor substrate;
   forming a Schottky electrode of titanium (Ti) or molybdenum (Mo) in such a manner that the Schottky electrode is in Schottky contact with an n-type semiconductor region of the semiconductor substrate, the n-type semiconductor region being exposed to the top surface of the semiconductor substrate;
   forming an ohmic electrode of nickel (Ni) in such a manner that the ohmic electrode is in ohmic contact with the exposed p-type semiconductor region; and
   annealing the ohmic electrode at 400° C. or more, wherein the forming of the Schottky electrode is performed earlier than the forming of the ohmic, and
   the forming of the ohmic electrode includes covering at least a portion of the Schottky electrode from above with the ohmic electrode.

2. The method according to claim 1, wherein the forming of the Schottky electrode is performed earlier than the forming of the p-type semiconductor region.

3. The method according to claim 2, wherein the forming of the p-type semiconductor region includes introducing a p-type impurity into the semiconductor substrate by using the Schottky electrode as a mask.

4. The method according to claim 3, wherein the forming of the Schottky electrode includes forming the Schottky electrode on the top surface of the semiconductor substrate and forming an opening to the Schottky electrode in such a manner that the top surface of the semiconductor substrate is exposed through the opening, the forming of the p-type semiconductor region includes introducing the p-type impurity into the top surface of the semiconductor substrate through the opening of the Schottky electrode, and the forming of the ohmic electrode includes forming the ohmic electrode on the top surface of the semiconductor substrate through the opening of the Schottky electrode.

5. The method according to claim 1, wherein the semiconductor substrate includes an n-type drift layer located on the top surface side of the semiconductor substrate and an n-type contact layer located under the drift layer, an impurity concentration of the contact layer being higher than an impurity concentration of the drift layer, and the impurity concentration of the drift layer is higher on the contact layer side than on the top surface side of the semiconductor substrate.

6. The method according to claim 1, wherein the forming of the p-type semiconductor region includes forming a first region and a second region in such a manner that an impurity concentration of the first region is higher than an impurity concentration of the second region, the forming of the first region includes exposing the first region to the top surface of the semiconductor substrate and separating the first region from the n-type semiconductor region of the semiconductor substrate, and the forming of the second region includes locating the second region around the first region and adjacent to the n-type semiconductor region of the semiconductor substrate.

7. The method according to claim 6, wherein the forming of the p-type semiconductor region includes forming a mask on the top surface of the semiconductor substrate, the mask having an opening smaller than a width of the p-type semiconductor region to be formed, the forming of the p-type semiconductor region further including introducing a first p-type impurity into the semiconductor substrate through the opening of the mask, introducing a second p-type impurity into the semiconductor substrate through the opening of the mask, and thermally diffusing the introduced first and second p-type impurities, and a thermal diffusion coefficient of the second p-type impurity is higher than a thermal diffusion coefficient of the first p-type impurity.

8. The method according to claim 6, wherein the forming of the p-type semiconductor region includes forming a mask on the top surface of the semiconductor substrate, the mask having an opening smaller than a width of the p-type semiconductor region to be formed, the forming of the p-type semiconductor region further including introducing a p-type impurity into the semiconductor substrate through the opening of the mask, enlarging the opening of the mask by isotropic etching after the introduction of the p-type impurity, and introducing the p-type impurity into the semiconductor substrate through the enlarged opening of the mask.

9. A method of making a semiconductor device comprising:

forming a p-type semiconductor region in an n-type semiconductor substrate of silicon carbide (SiC) in such a manner that the p-type semiconductor region is partially exposed at a top surface of the semiconductor substrate;

forming a Schottky electrode of a material other than nickel (Ni) in such a manner that the Schottky electrode is in Schottky contact with an n-type semiconductor region of the semiconductor substrate, the n-type semiconductor region being exposed at the top surface of the semiconductor substrate; and forming an ohmic electrode of nickel (Ni) in such a manner that the ohmic electrode is in ohmic contact with the exposed p-type semiconductor region, wherein the forming of the Schottky electrode is performed earlier than the forming of the ohmic electrode.

10. The method according to claim 9, wherein the forming of the Schottky electrode is performed earlier than the forming of the p-type semiconductor region.

11. The method according to claim 10, wherein the forming of the p-type semiconductor region includes introducing a p-type impurity into the semiconductor substrate by using the Schottky electrode as a mask.

12. The method according to claim 11, wherein the forming of the Schottky electrode includes forming the Schottky electrode on the top surface of the semiconductor substrate and forming an opening to the Schottky electrode in such a manner that the top surface of the semiconductor substrate is exposed through the opening, the forming of the p-type semiconductor region includes introducing the p-type impurity into the top surface of the semiconductor substrate through the opening of the Schottky electrode, and the forming of the ohmic electrode includes forming the ohmic electrode on the top surface of the semiconductor substrate through the opening of the Schottky electrode.

13. The method according to claim 9, wherein the semiconductor substrate includes an n-type drift layer located on the top surface side of the semiconductor substrate and an n-type contact layer located under the drift layer, an impurity concentration of the contact layer being higher than an impurity concentration of the drift layer, and the impurity concentration of the drift layer is higher on the contact layer side than on the top surface side of the semiconductor substrate.

14. The method according to claim 9, wherein the forming of the p-type semiconductor region includes forming a first region and a second region in such a manner that an impurity concentration of the first region is higher than an impurity concentration of the second region, the forming of the first region includes exposing the first region to the top surface of the semiconductor substrate and separating the first region from the n-type semiconductor region of the semiconductor substrate, and the forming of the second region includes locating the second region around the first region and adjacent to the n-type semiconductor region of the semiconductor substrate.

15. The method according to claim 14, wherein the forming of the p-type semiconductor region includes forming a mask on the top surface of the semiconductor substrate, the mask having an opening smaller than a width of the p-type semiconductor region to be formed, the forming of the p-type semiconductor region further including introducing a first p-type impurity into the semiconductor substrate through the opening of the mask, introducing a second p-type impurity into the semiconductor substrate through the opening of the mask, and thermally diffusing the introduced first and second p-type impurities, and a thermal diffusion coefficient of the second p-type impurity is higher than a thermal diffusion coefficient of the first p-type impurity.

16. The method according to claim 14, wherein the forming of the p-type semiconductor region includes forming a mask on the top surface of the semiconductor substrate, the mask having an opening smaller than a width of the p-type semiconductor region to be formed, the forming of the p-type semiconductor region further including introducing a p-type impurity into the semiconductor substrate through the opening of the mask, enlarging the opening of the mask by isotropic etching after the introduction of the p-type impurity, and introducing the p-type impurity into the semiconductor substrate through the enlarged opening of the mask.

17. The method according to claim 9, wherein the Schottky electrode is formed of titanium (Ti) or molybdenum (Mo).

18. The method according to claim 9, further comprising annealing the ohmic electrode at 400° C. or more.

19. The method according to claim 9, wherein the forming of the ohmic electrode includes covering at least a portion of the Schottky electrode from above with the ohmic electrode.

* * * * *